(12) United States Patent
Park et al.

(10) Patent No.: US 9,601,554 B2
(45) Date of Patent: Mar. 21, 2017

(54) TRANSPARENT DISPLAY DEVICE AND METHOD OF MANUFACTURING THE SAME

(71) Applicant: Samsung Display Co., Ltd., Yongin-si, Gyeonggi-do (KR)

(72) Inventors: Yong-Han Park, Hwaseong-si (KR); Hye Eun Park, Hwaseong-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/850,068

(22) Filed: Sep. 10, 2015

(65) Prior Publication Data

US 2016/0197131 A1    Jul. 7, 2016

(30) Foreign Application Priority Data

Jan. 2, 2015   (KR) ................ 10-2015-0000222

(51) Int. Cl.
*H01J 1/62* (2006.01)
*H01L 27/32* (2006.01)
*G02F 1/1333* (2006.01)
*H01L 51/52* (2006.01)
*H01L 51/56* (2006.01)

(52) U.S. Cl.
CPC .... *H01L 27/3267* (2013.01); *G02F 1/133377* (2013.01); *H01L 27/3211* (2013.01); *H01L 27/3232* (2013.01); *H01L 27/3246* (2013.01); *H01L 51/5206* (2013.01); *H01L 51/5246* (2013.01); *H01L 51/5281* (2013.01); *H01L 51/56* (2013.01); *G02F 2201/44* (2013.01); *H01L 2227/323* (2013.01); *H01L 2251/301* (2013.01); *H01L 2251/305* (2013.01); *H01L 2251/308* (2013.01)

(58) Field of Classification Search
CPC .................................... G02F 2201/44
USPC ....................... 313/505, 506, 498
See application file for complete search history.

(56) References Cited

U.S. PATENT DOCUMENTS 9,065,066 B2 * 6/2015 Seo ............... H01L 51/5016

FOREIGN PATENT DOCUMENTS

| KR | 1020120106432 A | 9/2012 |
| KR | 1020120127085 A | 11/2012 |
| KR | 1020130033618 A | 4/2013 |
| KR | 1020130064486 A | 6/2013 |
| KR | 1020130071543 A | 7/2013 |

* cited by examiner

*Primary Examiner* — Vip Patel
(74) *Attorney, Agent, or Firm* — Innovation Counsel LLP

(57) ABSTRACT

A transparent display device includes a first substrate including a pixel region and a light amount controlling region. An organic light emitting display is positioned in the pixel region and includes an anode electrode, a pixel defined layer, an organic light emitting layer positioned on the anode electrode and in an opening part of the pixel defined layer, and a cathode electrode positioned on the organic light emitting layer. A liquid crystal display is positioned in the light amount controlling region and includes a pixel electrode, a roof layer facing the pixel electrode, and a liquid crystal layer having a plurality of microcavities between the pixel electrode and the roof layer. The microcavities include liquid crystal molecules. A second substrate seals the organic light emitting display and the liquid crystal display.

13 Claims, 22 Drawing Sheets

TRANSPARENT DISPLAY DEVICE AND METHOD OF MANUFACTURING THE SAME

CROSS-REFERENCE TO RELATED APPLICATION

This application claims priority to and the benefit of Korean Patent Application No. 10-2015-0000222 filed in the Korean Intellectual Property Office on Jan. 2, 2015, the entire contents of which are incorporated herein by reference.

BACKGROUND (a) Field

The present application relates to a transparent display device and a method of manufacturing the same.

(b) Description of the Related Art

In accordance with a recently last development of an Image display device in which CRT monitors have conventionally made up the main part, flat panel display devices such as a liquid crystal display (LCD), a field emission display (FED), a plasma display panel (PDP), an organic light emitting diode (OLED), and the like has been developed, and image display devices which may also be even bent, such as electronic paper are introduced one after another.

Among these, the OLED is a self light-emitting device in which electrons injected from an electron injection electrode (cathode electrode) and holes injected from a hole injection electrode (anode electrode) are combined in an emitting layer to form exciton and the exciton emits light while discharging energy.

Due to the above-mentioned principle, since the OLED does not require a separate light source unlike the liquid crystal display which was conventionally used as a thin type display device, a volume and weight of the device may be reduced, and since the OLED has a response speed faster a thousand times or more as compared to the liquid crystal display, it leaves no afterimages when displaying a moving picture, and consequently, is highlighted as a next-generation display device.

In addition, in the case in which both the cathode and the anode are configured by a transparent electrode, a driving thin film transistor is formed of an optically transparent material, or an area occupied by the driving thin film transistor in a pixel configured by the driving thin film transistor and the OLED is decreased. A transparent active matrix OLED (AM-OLED) in which light is emitted to both sides of a substrate and information may be displayed on both surfaces of the substrate may also be manufactured.

However, in the case in which the transparent display device is implemented using the transparent AM-OLED, since the transparent AM-OLED is configured to always transmit external light, there is a problem that a black mode in which the transmitted light should be perfectly blocked may not be represented In addition, there is also a problem that visibility is sharply degraded in outdoors in which there is a large amount of light, due to reflection of external light.

In order to solve the above-mentioned problems, display devices in which a plurality of panels performing different functions are stacked are recently highlighted, and among the display devices in which the plurality of panels are stacked, a display device in which a reflective panel selectively reflecting the external light using a liquid crystal and a display panel displaying an image are stacked has been disclosed.

However, since the above-mentioned display device according to the related art has a structure in which the plurality of panels are vertically stacked, a thickness thereof is thick, and consequently, there is a limit in implementing a transparent flexible display device.

The above information disclosed in this Background section is only for enhancement of understanding of the background and therefore it may contain information that does not form the prior art that is already known in this country to a person of ordinary skill in the art.

SUMMARY

The inventive concept has been made in an effort to provide a transparent display device having features of having a thin thickness.

An exemplary embodiment provides a transparent display device including: a first substrate including a pixel region and a light amount controlling region positioned so as to be in parallel to the pixel region; an organic light emitting display positioned in the pixel region on the first substrate and including an anode electrode, a pixel defined layer covering an edge of the anode electrode and including an opening part extending to a portion of the anode electrode, an organic light emitting layer positioned on the anode electrode and in the opening part, and a cathode electrode positioned on the organic light emitting layer; a liquid crystal display positioned in the light amount controlling region on the first substrate and including a pixel electrode, a roof layer facing the pixel electrode, and a liquid crystal layer having a plurality of microcavities partitioned from each other between the pixel electrode and the roof layer, wherein the microcavities comprise liquid crystal molecules; and a second substrate sealing the organic light emitting display and the liquid crystal display.

The anode electrode may include a first layer comprising a transparent conductive material, a second layer comprising a metal material, and a third layer comprising the transparent conductive material, and the pixel electrode comprises the same material as the first layer or the third layer.

The first layer and the third layer comprises indium-tin-oxide (ITO) or indium-zinc-oxide (IZO), and the second layer comprises any one of silver (Ag), aluminum (Al), magnesium (Mg), lithium (Li), calcium (Ca), aluminum-lithium (Al—Li), magnesium-indium (Mg—In), magnesium-silver (Mg—Ag), and aluminum-silver (Al—Ag).

The pixel region may include a first pixel, a second pixel, and a third pixel, the first pixel, the second pixel, and the third pixel may be arranged in a first row while being repeated, and the light amount controlling regions may be arranged in a second row while being repeated.

The transparent display device may further include a first valley between the pixel region and the light amount controlling region.

The transparent display device may further include a liquid injection hole extending to a portion of a microcavity of the microcavities.

The liquid crystal injection hole may be positioned in one side surface of the microcavity facing the pixel region.

The transparent display device may further include an overcoat positioned on the roof layer and covering the liquid crystal injection hole.

The liquid crystal display may be configured to adjust an amount of light incident from the outside.

The liquid crystal display may be configured to be driven in a vertical electric field mode.

The transparent display device may include a first polarizing plate attached to a lower surface of the first substrate; and a second polarizing plate attached to an upper surface of the second substrate.

The first polarizing plate and the second polarizing plate may include a polarizing element configured, to produce polarized light and a tri-acetyl-cellulose (CAC) layer for securing durability.

The second substrate may be formed of any one of glass, quartz, plastic, and a metal or is formed by depositing an inorganic layer and an organic layer.

Another embodiment provides a method of manufacturing a transparent display device including: preparing a first substrate including a pixel region and a light amount controlling region; forming an organic light emitting display positioned in the pixel region of the first substrate and a liquid crystal display positioned in the light amount controlling region of the first substrate; and forming a second substrate sealing the organic light emitting display and the liquid crystal display.

The forming of the organic light emitting display in the pixel region may include: forming an anode electrode; forming a pixel defined layer including an opening part exposing a portion of the anode electrode; forming an organic light emitting layer positioned on the anode electrode exposed by the opening part; and forming a cathode electrode positioned on the organic light emitting layer, and the forming of the liquid crystal display in the light amount controlling region includes: forming a pixel electrode; forming a sacrificial layer on the pixel electrode; forming a common electrode on the sacrificial layer; forming a roof layer on the sacrificial layer; forming a liquid crystal infection hole by exposing a portion of the sacrificial layer; forming a microcavity between the pixel electrode and the common electrode by removing the sacrificial layer; forming a liquid crystal layer by injecting a liquid crystal material into the microcavity through the injection hole; and sealing the microcavity by forming an overcoat on the roof layer.

The anode electrode may include a first layer comprising a transparent conductive material a second layer comprising a metal material, and a third layer comprising the transparent conductive material, and the pixel electrode may comprise the same material as the first layer or the third layer.

The first layer and the third layer may comprise indium-tin-oxide (ITO) or indium-zinc-oxide (IZO), and the second layer may comprise any one of silver (Ag), aluminum (Al), magnesium (Mg), lithium (Li), calcium (Ca), aluminum-lithium (Al—Li), magnesium-indium (Mg—In), magnesium-silver (Mg—Ag), and aluminum-silver (Al—Ag).

The pixel defined layer and the roof layer may be made of the same material as each other.

In addition, to the above-mentioned features, other features of the inventive concept may be apparently understood by those skilled in the art to which the present application pertains from the following description.

According to an embodiment, there are the following effects.

According to an embodiment, since the transparent display device has the organic light emitting display disposed in a pixel region between the first substrate and the second substrate in order to display the pixel and the liquid crystal display disposed in the light amount controlling region positioned so as to be in parallel to and adjacent to the pixel region in order to adjust transmission of the external light, the thickness thereof is not thick, and consequently, the transparent display device may be advantageously bent.

In addition, since the liquid crystal display of the transparent display device according to the exemplary embodiment may be implemented by the plurality of microcavities 305 in which the plurality of pixels are partitioned from each other, there is no degradation in image quality occurring when the transparent display device is bent or curved.

In addition, in the method of manufacturing the transparent display device according to the exemplary embodiment, the organic light emitting display positioned in the pixel region of the first substrate and the liquid crystal display positioned in the light amount controlling unit of the first substrate are simultaneously formed, it is possible to decrease the number of processes of manufacturing the transparent display device and reduce costs for manufacturing the transparent display device.

Additionally, other features according to the inventive concept may be newly understood through the exemplary embodiments.

DETAILED DESCRIPTION OF THE EMBODIMENTS

Figure 1:
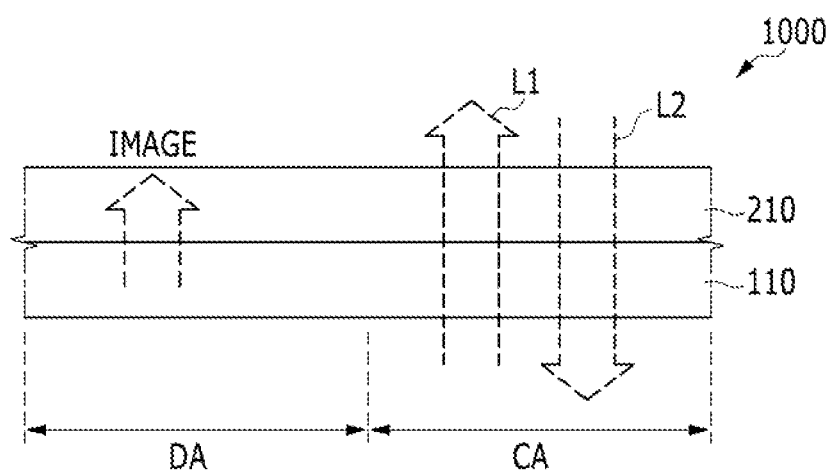
FIG. 1 is a cross-sectional view schematically showing a transparent display device according to an exemplary embodiment.

In the following detailed description, the inventive concept will be described more fully hereinafter with reference to the accompanying drawings, in which exemplary embodiments are shown As those skilled in the art would realize, the described embodiments may be modified in various different ways, all without departing from the spirit or scope of the inventive concept.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Hereinafter, a transparent display device according to an exemplary embodiment will be schematically described.

FIG. 1 is a cross-sectional view schematically showing a transparent display device 1000 according to an exemplary embodiment.

Referring to FIG. 1, the transparent display device 1000 according to an exemplary embodiment may include a first substrate 110, a display unit provided on the first substrate 110, and a second substrate 210 sealing the display unit. The display unit includes a pixel region DA that emits light to the outside and a light amount controlling region CA which is adjacent to the pixel region DA and transmits external light.

The pixel region DA of the transparent display device 1000 may be configured of an organic light emitting display that emits light to the outside and the light amount controlling region CA may be configured of a liquid crystal display that is adjacent to the organic light emitting display and controls an amount of light introduced from the outside.

Although not shown, the transparent display device 1000 may separately include a thin film transistor driving the organic light emitting display and a thin film transistor driving the liquid crystal display, respectively. Particularly, an arrangement of molecules in a liquid crystal layer included in the liquid crystal layer is changed by the driving of the thin film transistor connected to the liquid crystal display, thereby making it possible to adjust the amount of light introduced from the outside.

Hereinafter, an operation of the transparent display device 1000 according to an exemplary embodiment will be described.

Figure 9:
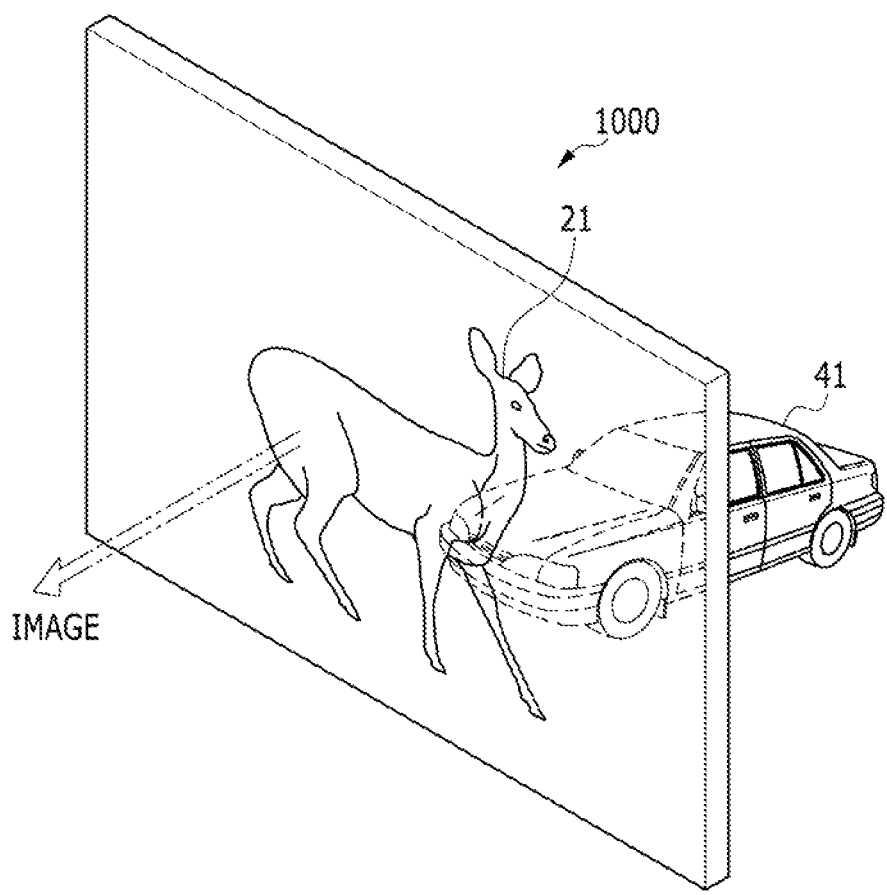
FIG. 9 is a drawing showing an image implementation example in a transparent mode of the transparent display device according to an exemplary embodiment.

FIG. 9 is a drawing showing an image implementation example in a transparent mode of the transparent display device 1000 according to an exemplary embodiment.

Referring to FIGS. 1 and 9, the transparent display device 1000 may implement an image in a transparent mode.

When the transparent display device 1000 is in the transparent mode transmitting light, the transparent display device 1000 becomes a transparent state, e.g., is put in a transparent state.

Specifically, in the case in which the organic light emitting display is in an ON state and the liquid crystal display is in an ON state, a user positioned at a side in which the image is implemented may view the image 21 of the organic light emitting display, and may view an image of an object 41 positioned at an outer side of the first substrate 110 through external light L1 that is transmitted from the outer side of the first substrate 110 to an outer side of the second substrate 210. In this case, a user positioned at a side opposite to the side in which the image is implemented may also view an image of an object positioned at the outer side of the second substrate 210 through external light L2 that is transmitted from the outer side of the second substrate 210 to the outer side of the first substrate 110.

In this case, an amount of external light is adjusted by the thin film transistor connected to the liquid crystal display, thereby making it possible to adjust transparency.

Figure 10:
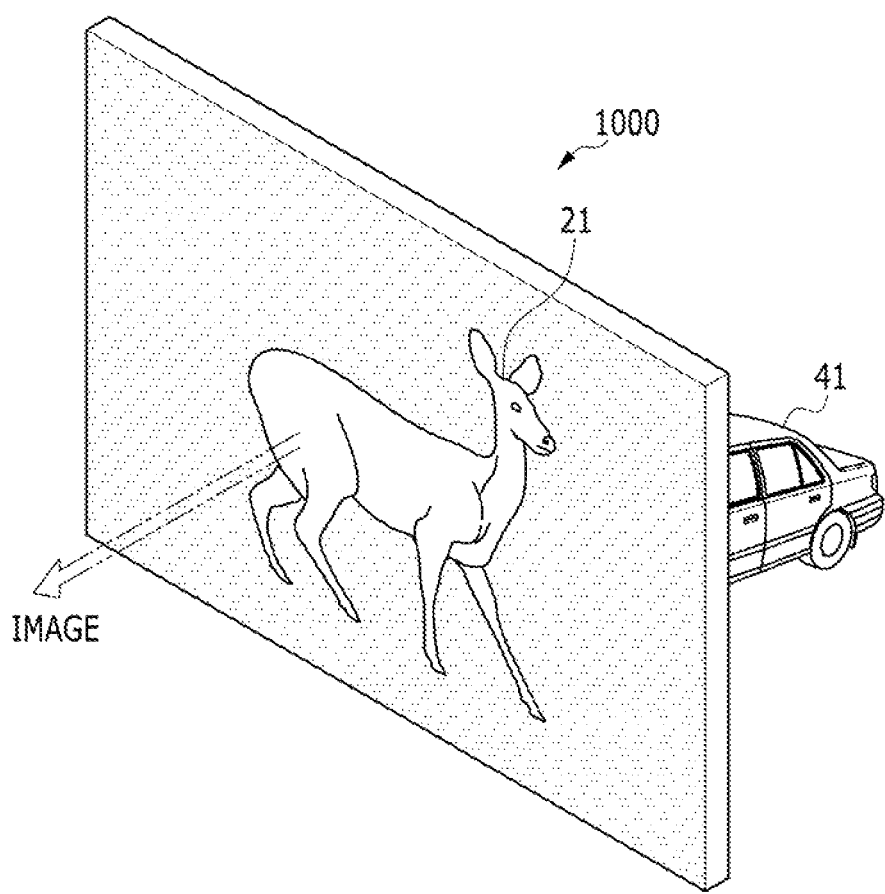
FIG. 10 is a drawing showing an image implementation example in a black mode of the transparent display device according to an exemplary embodiment.

FIG. 10 is a drawing showing an. image implementation example in a black mode of the transparent display device 1000 according to an exemplary embodiment.

Referring to FIG. 10, the transparent display device 1000 may implement an image in a black mode.

When the transparent display device 1000 is in the black mode that does not transmit light, the transparent display device 1000 becomes an opaque state, e.g., is put in an opaque state.

Specifically, in the case in which the display device 1000 needs to display black, the organic light emitting display becomes an OFF state, e.g., is put in the OFF state, and in this case, the liquid crystal display also becomes an OFF state.

In the case in which the organic light emitting display is in the ON state and the liquid crystal display is in the OFF state, the user positioned at the side in which the image is implemented may view information displayed through the image 21 of the organic light emitting display, and since the external light is blocked by the liquid crystal display, the user positioned at the side in which the image is implemented may not view the object 41 positioned at the outer side of the first substrate 110. Meanwhile, the user positioned at the side opposite to the side in which the image is implemented may also not view the object positioned at the outer side of the second substrate 210.

Figure 11:
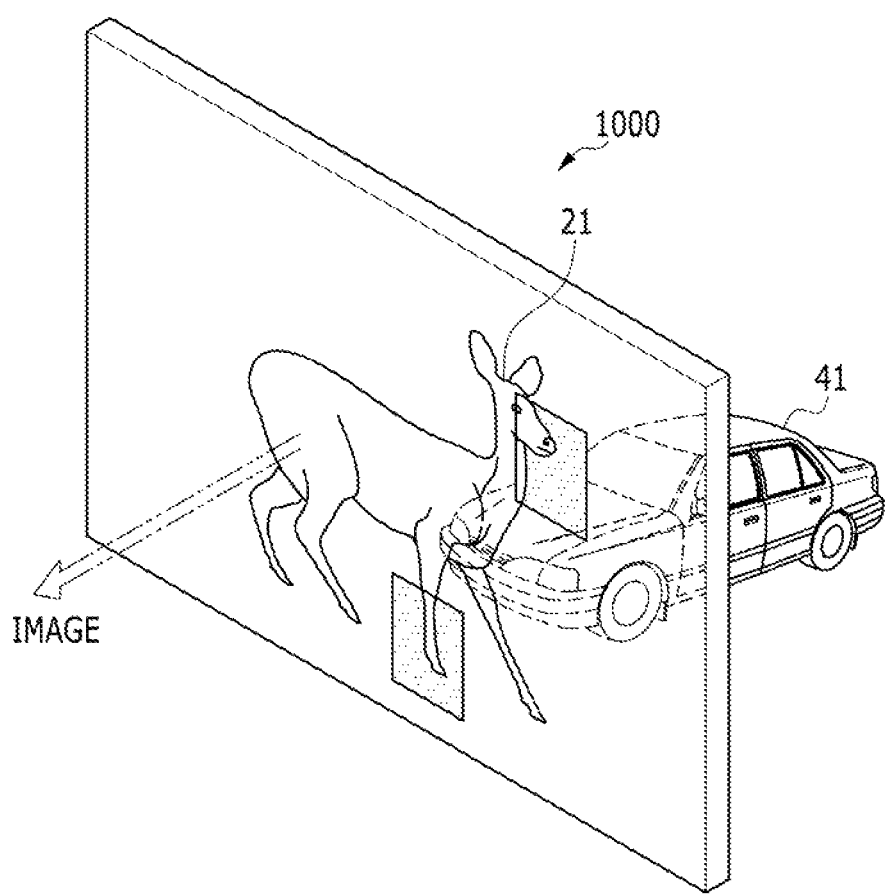
FIG. 11 is a drawing showing an image implementation example in a partial black mode of the transparent display device according to an exemplary embodiment.

FIG. 11 is a drawing showing an image implementation example in a partial black mode of the transparent display device 1000 according to an exemplary embodiment.

Referring to FIG. 11, the transparent display device 1000 may implement an image in a partial black mode. That is, the partial black mode in which an opaque region that does not partially transmit the light is set may be implemented. In this case, the light amount controlling region CA is divided into a transparent region and an opaque region.

In the case in which the transparent display device 1000 needs to display the partial black mode, the thin film transistor connected to the transparent region of the liquid crystal display becomes the ON state, e.g., is put in the ON state, and the thin film transistor connected to the opaque region of the liquid crystal display becomes the OFF state. The user positioned at the side in which the image is implemented may not view the object 41 positioned at a side that is opposite to the side in which the image is implemented, in the opaque region. In addition, the user positioned at the side in which the image is implemented may view the object 41 positioned at the side that is opposite to the side in which the image is implemented, in the transparent region other than the opaque region.

Figure 2:
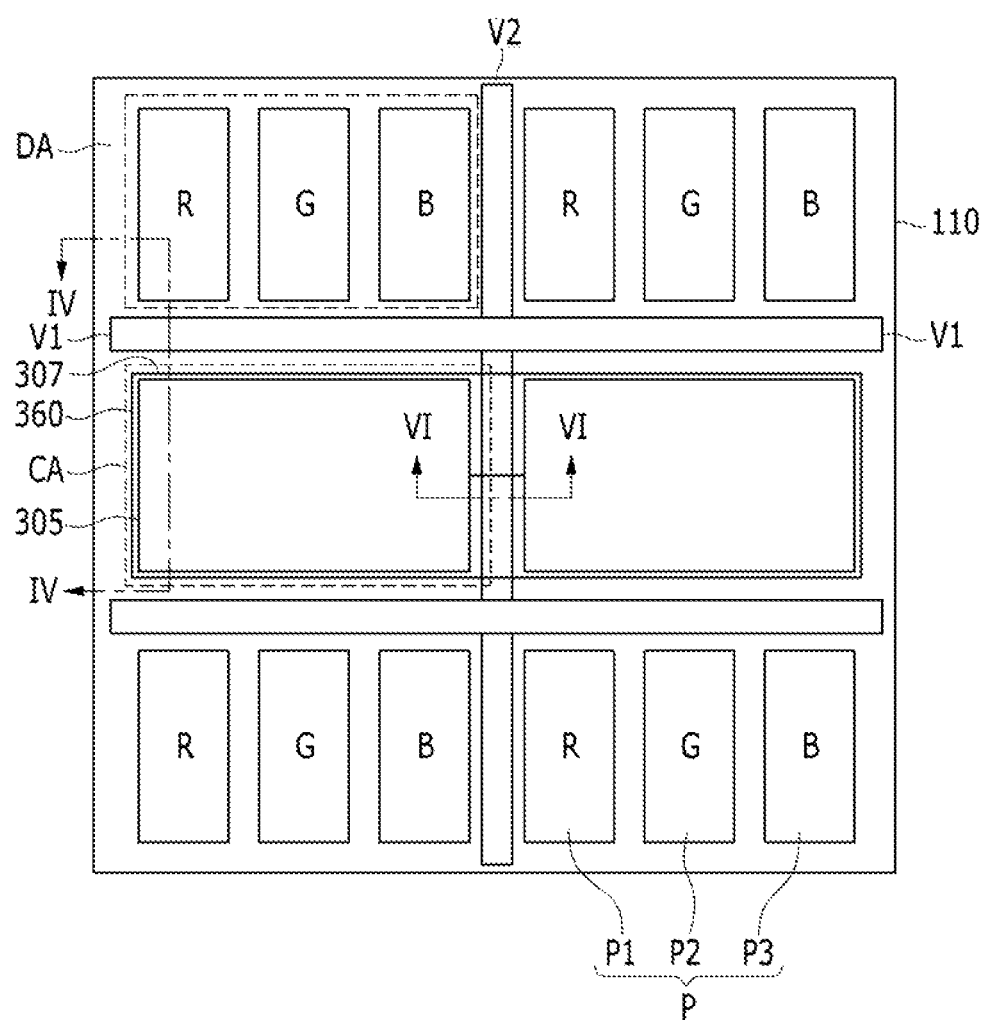
FIG. 2 is a plan view showing an example of the transparent display device shown in FIG. 1.
Figure 3:
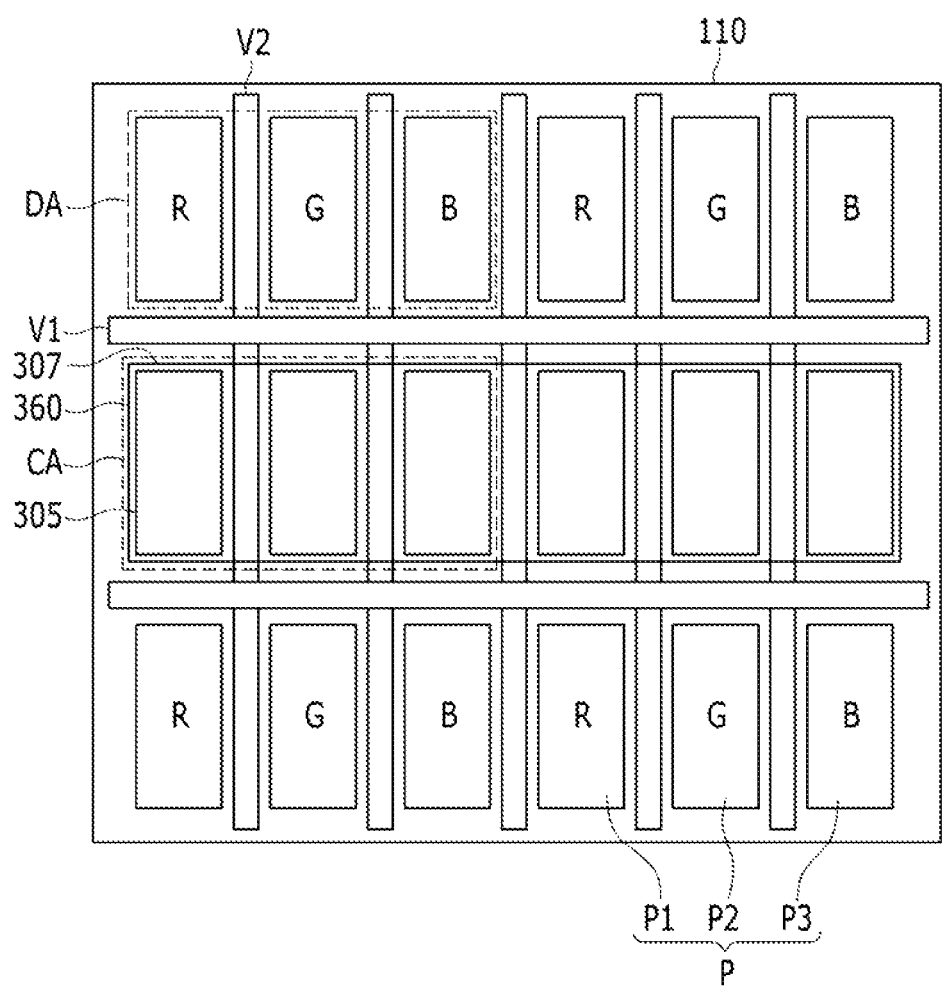
FIG. 3 is a plan view showing another example of the transparent display device shown in FIG. 1.

FIG. 2 is a plan view showing an example of the transparent display device 1000 shown in FIG. 1 and FIG. 3 is a plan view showing another example of the transparent display device 1000 shown in FIG. 1.

Referring to FIGS. 2 and 3, the first substrate 110 includes the pixel region DA displaying an image and the light amount controlling region CA controlling transmission of external light.

A pixel P may include a first pixel P1, a second pixel P2, and a third pixel P3.

The first pixel P1 includes a red R pixel, the second pixel P2 includes a green G pixel, and the third pixel P3 includes a blue B pixel.

Embodiments are not limited thereto, but may include a fourth pixel other than the red R pixel, the green G pixel, and the blue B pixel and may include pixels of various colors The light amount controlling region CA may be disposed to be adjacent to the pixel region DA.

The first pixel P1, the second pixel P2, and the third pixel P3 are arranged in a first row while being repealed, and the light amount controlling regions CA are arranged in a second row while being repeated. By way of example, the first pixel P1, the second pixel P2, and the third pixel P3 may also be arranged in odd-numbered rows while being repeated and the light amount controlling regions CA may also be arranged in even-numbered rows while being repeated. The first pixel P1, the second pixel P2, and the third pixel P3 may also be arranged in even-numbered rows while being repeated and the light amount controlling regions CA may also be arranged in odd-numbered rows while being repeated.

Meanwhile, although not shown, the first pixel P1, the second pixel P2, and the third pixel P3 may also be arranged in a first column while being repeated, and the light amount controlling regions CA may also be arranged in a second column while being repeated.

The first pixel P1, the second pixel P2, and the third pixel P3 may be formed so as to have the same size as each other. The light amount controlling region CA may be formed so as to have a size equal to the sum of the first pixel P1, the second pixel P2, and the third pixel P3, but the sizes are not necessarily limited thereto.

For example, the light amount controlling regions CA may be provided so as to be connected to each other across the first pixel P1, the second pixel P2, and the third pixel P3 as can be seen in FIG. 2. In another example, the light amount controlling regions CA may be independently provided for each of the first pixel P1, the second, pixel P2, and the third pixel P3 as can be seen in FIG. 3.

In case of the exemplary embodiment of FIG. 2, since an area of the light amount controlling regions CA in which the external light transmits may be widened, a total of transmittance of the display unit may be increased.

A microcavity 305 covered by a roof layer 360 is formed on the first substrate 110. The roof layers 360 may be connected in a row direction and one roof layer 360 may form a plurality of microcavities 305.

A first valley V1 is positioned between the pixel region DA and the light amount controlling region CA along a pixel row direction and a second valley V2 is positioned between a plurality of pixel columns.

A plurality of roof layers 360 are separated from each other while having the first valley V1 therebetween. At a portion that is in contact with the first valley V1, the microcavity 305 is not covered by the roof layer 360 and may be exposed to the outside. This is referred to as a liquid crystal injection hole 307.

Each roof layer 360 is formed so as to be spaced apart from the first substrate 110 between second valleys V2 that are adjacent to each other, thereby forming the microcavity 305. In addition, each roof layer 360 is formed so as to be attached to both sides of the first substrate 110 in the second valley V2, thereby covering both sides of the microcavity 305.

The structure of the transparent display device described above is merely illustrative, and may be variously modified. For example, the layout of the pixel region DA, the light amount controlling region CA, the first valley V1, and the second valley V2 may be changed, the plurality of roof layers 360 may also be connected to each other in the first valley V1, and some of the respective roof layers 360 are formed so as to be spaced apart from the first substrate 110 in the second valley V2, such that the microcavities 305 that are adjacent to each other may also be connected to each other.

Next, one pixel of the transparent display device according to an exemplary embodiment will be briefly described with reference to FIGS. 2, 3, 4, 5, and 6.

Figure 4:
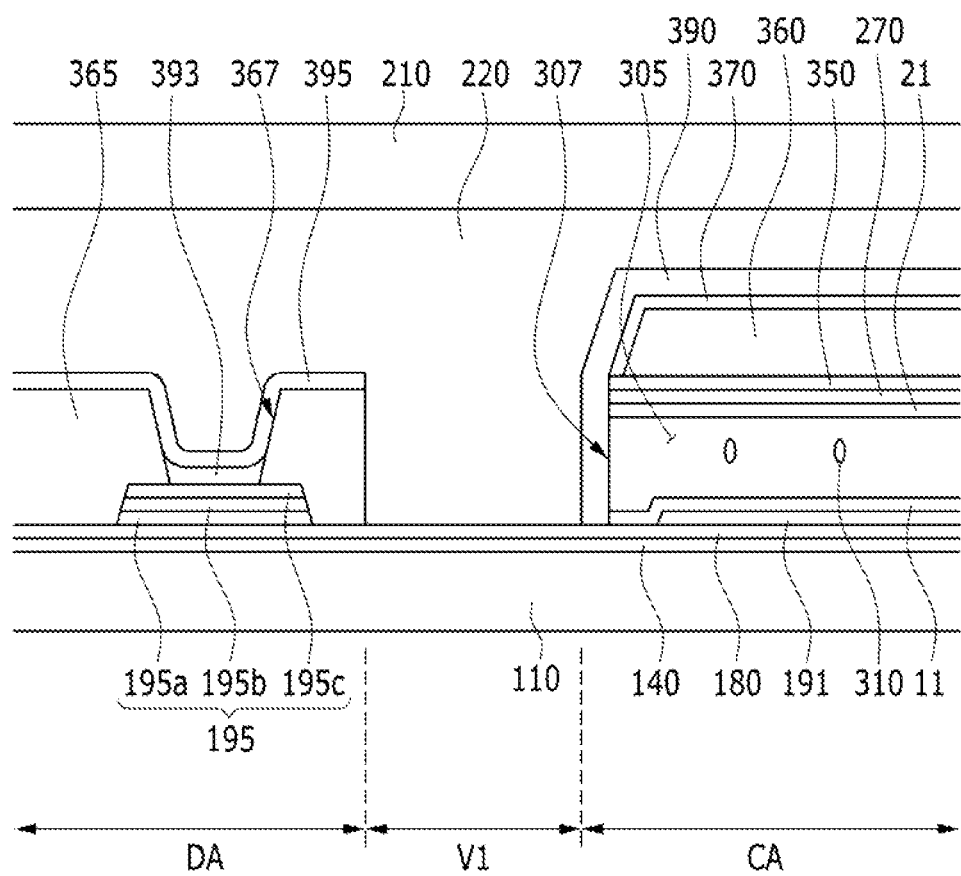
FIG. 4 is a cross-sectional view showing a portion of the transparent display device according to an exemplary embodiment taken along a line IV-IV of FIG. 2.
Figure 5:
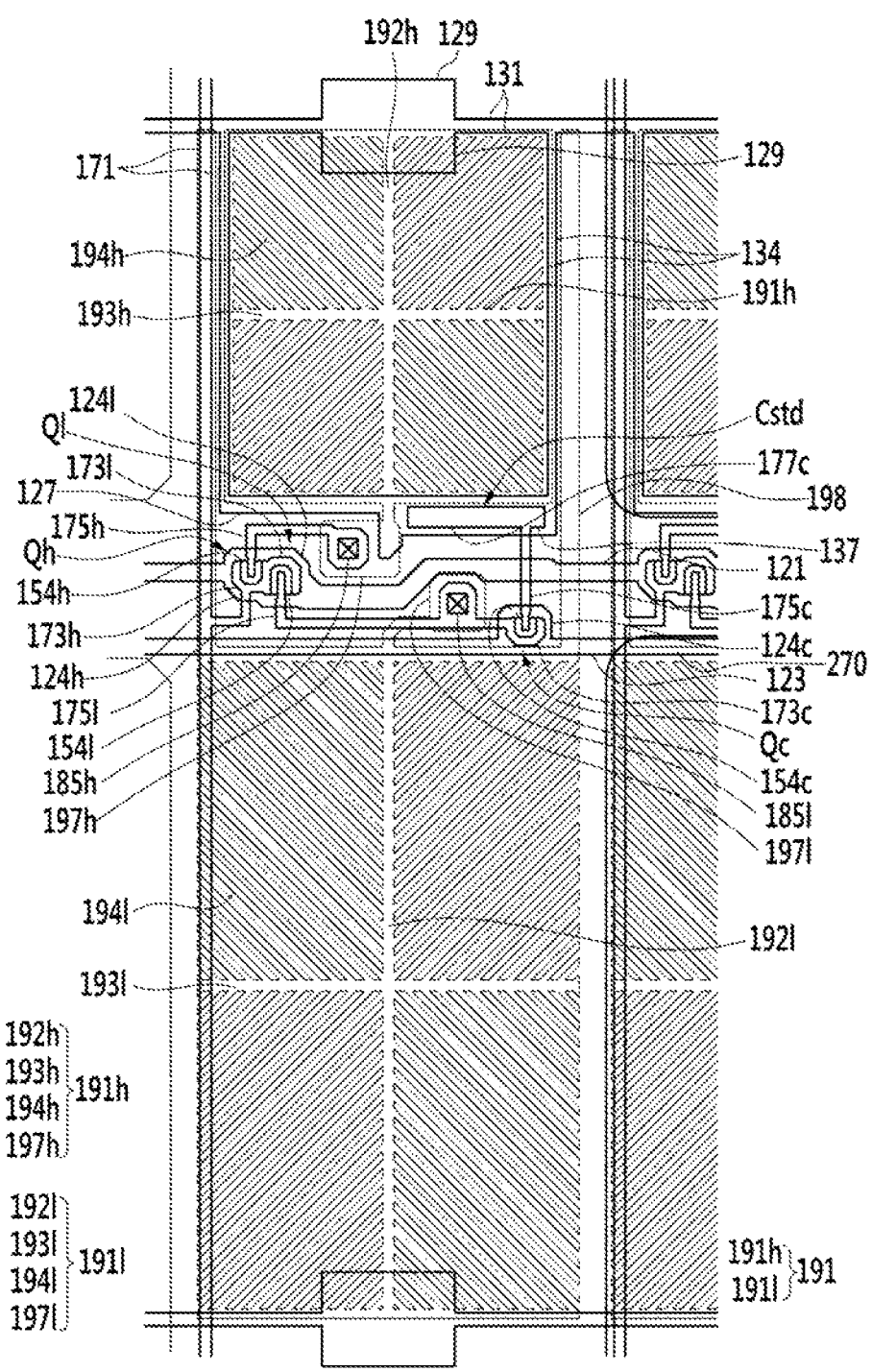
FIG. 5 is a plan view showing one pixel included in a light amount controlling region of the transparent display device according to an exemplary embodiment.
Figure 6:
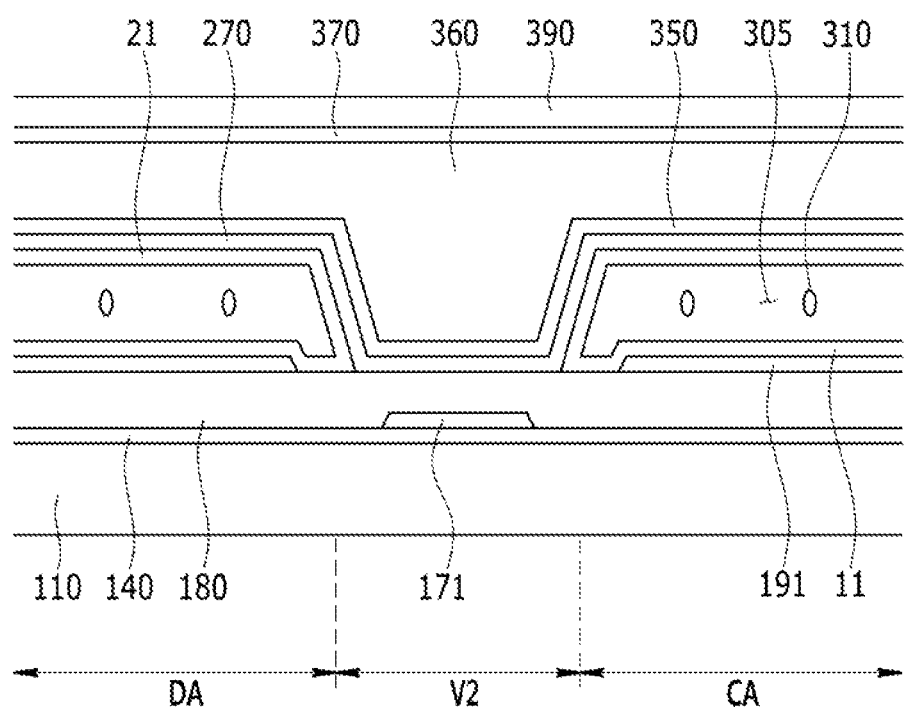
FIG. 6 is a cross-sectional view showing a portion of the transparent display device according to an exemplary embodiment taken along a line VI-VI of FIG. 2.

FIG. 4 is a cross-sectional view showing a portion of the transparent display device according to an exemplary embodiment taken along a line IV-IV of FIG. 2. FIG. 5 is a plan view showing one pixel in included in a light amount controlling region CA of the transparent display device according to an exemplary embodiment. FIG. 6 is a cross-sectional view showing a portion of the transparent display device according to an exemplary embodiment taken along a line VI-VI of FIG. 2.

Referring to FIGS. 2 and 4, the transparent display device according to an exemplary embodiment includes the organic light emitting display positioned in the pixel region PA and the liquid crystal display positioned in the light amount controlling region CA.

First, one pixel of the organic light emitting display will be briefly described.

Meanwhile, the organic light emitting display is classified into a front emitting type, a rear emitting type, and both sides emitting type. Hereinafter, the front emitting type is described by way of example.

A gate insulating layer 140 and a passivation layer 180 are formed so as to be sequentially stacked on the first substrate 110. The organic light emitting display including an anode electrode 195, an organic light emitting layer 393, and a cathode electrode 395 is disposed on the pixel region DA on the passivation layer 180.

Although not shown, the anode electrode 195 is disposed in each of a plurality of pixels while being connected to the thin film transistor. That is, a plurality of anode electrodes 195 are disposed in each of the plurality of pixels so as to be spaced apart from each other.

In this case, the anode electrode 193 may be formed in a triple layer in which a first layer 195a, a second layer 195b, and a third layer 195c are sequentially stacked. The first layer 195a may be made of indium-tin-oxide (ITO) or indium-zinc-oxide (IZO), which is a material having a relatively high work function value, among transparent conductive materials, the second layer 195b may be made of silver (Ag), aluminum (Al), magnesium (Mg), lithium (Li), calcium (Ca), aluminum-lithium (Al—Li), magnesium-indium (Mg—In), magnesium-silver (Mg—Ag), aluminum-silver (Al—Ag), or the like, which is a material having a relatively low work function value, and the third layer 195c may be made of indium-tin-oxide (ITO) or indium-zinc-oxide (IZO).

A pixel defined layer 365 having an opening part 367 that extends to and exposes a portion of the anode electrode 195 is formed on the passivation layer 180. That is, the pixel defined layer 365 has a plurality of opening parts 367 formed in the respective pixels. In this case, the organic light emitting layer 393 may be formed in each opening part 367 formed by the pixel defined layer 365. Thereby, the pixel region DA in which the respective organic light emitting layers 393 are formed may be defined by the pixel defined layer 365.

In this case, the anode electrode 195 is disposed to correspond to the opening part 367 of the pixel defined layer 365. However, the anode electrode 195 is not necessarily disposed in the opening part 367 of the pixel defined layer 365, but may be disposed below the pixel defined layer 365 so that a portion of the anode electrode 195 is overlapped with the pixel defined layer 365.

The pixel defined layer 125 may be made of a resin such as a polyacrylates resin and polyimide resin, an inorganic material such as silica, or the like.

The organic light emitting layer 393 is formed on the anode electrode 195.

The organic light emitting layer 393 may be configured by a single layer made of luminous material, and may be configured in multiple layers of a hole injection layer, a hole transport layer, an emitting material layer, an electron transport layer, and an electron injection layer in order to improve luminous efficiency.

The above-mentioned organic light emitting layer 393 expresses colors of red R, green G, and blue B. A general method thereof is to pattern and use a separate organic material emitting colors of red R, green G, and blue B for each pixel region.

The cathode electrode 395 is formed on the organic light emitting layer 393. The cathode electrode 395 may be formed of a transparent conductive material.

Light emitted from the organic light emitting layer 393 is driven in the front emitting type in which the light is discharged toward the cathode electrode 395.

In the organic light emitting display as described above, when a predetermined voltage is applied to the anode electrode 195 and the cathode electrode 395 according to the selected color signal, holes injected from the anode electrode 195 and electrons provided from the cathode electrode 395 are transported to the organic light emitting layer 393 to form excitons. When the exciton is shifted from an excitation state to a ground state, light is produced and is discharged in a form of a visible ray.

In this case, since the emitted light passes through the cathode electrode 395 and goes outside, the pixel region DA of the organic light emitting display implements an arbitrary image.

The organic light emitting display is described as the front emitting type in the present specification, but is not limited thereto. For example, the organic light emitting display according to the inventive concept may be formed in the rear emitting type or both sides emitting type depending on a kind of material forming the anode electrode 195 and the cathode electrode 395.

The liquid crystal display positioned in the light amount controlling region CA that is adjacent to the pixel region DA while having the first valley V1 therebetween will be described below in detail.

In addition, a planarization layer 220 that protects the organic light emitting display and the liquid crystal display positioned on the first substrate 110 and planarizes surfaces thereof may be formed as an organic layer.

In addition, the second substrate 210 may be formed on the planarization layer 220. The second substrate 210 seals and protects the organic light emitting display and the liquid crystal display formed on the first substrate 110 from the outside.

The second substrate 210 may be sealed to the first substrate 110 by sealant and may be formed of various materials such as glass, quartz, ceramic, plastic, metal, and the like.

Meanwhile, the second substrate 210 may be a thin film encapsulation layer deposited on the organic light emitting device. The second substrate 210 may be formed by depositing an inorganic layer and an organic layer without using the sealant.

Hereinafter, the liquid crystal display according to the inventive concept will be described in detail with reference to FIGS. 2, 4, 5, and 6.

Referring to FIGS. 2, 4, 5, and 6, a plurality of gate conductors including a plurality of gate lines 121, a plurality of step-down gate lines 123, and a plurality of sustain electrode lines 131 are formed on the first substrate 110.

The gate line 121 and the step-down gate line 123 are mainly extended in a horizontal direction and transfer a gate signal. The gate conductor further includes a first gate electrode 124$h$ and second gate electrode 124$l$ which vertically protrude from the gate line 121 and a third gate electrode 124$c$ which upwardly protrudes from the step-down gate line 123. The first gate electrode 124$h$ and the second gate electrode 124$l$ are connected to each other, so as to form one protrusion part. In this case, protruded shapes of the first to third gate electrodes 124$h$, 124$l$, and 124$c$ may be changed.

The sustain electrode line 131 is also mainly extended in the horizontal direction and transfers a set voltage such as a common voltage Vcom, or the like. The sustain electrode line 131 includes a vertically protruding sustain electrode 129, a pair of vertical parts 134 which are downwardly extended so as to be substantially perpendicular to the gate line 121, and a horizontal part 127 connecting ends of the pair of vertical parts 134 to each other. The horizontal part 127 includes a capacity electrode 137 which is downwardly expanded.

A gate insulating layer 140 is formed on the gate conductors 121, 123, 124$h$, 124$l$, 124$c$, and 131. The gate insulating layer 140 may be made of an inorganic insulating material such as silicon nitride (SiNx), silicon, oxide (SiOx), or the like. In addition, the gate insulating layer 140 may be formed of a single film or multiple films.

A first semiconductor 154$h$, a second semiconductor 154$l$, and a third semiconductor 154$c$ are formed on the gate insulating layer 140. The first semiconductor 154$h$ may be positioned on the first gate electrode 124$h$, the second semiconductor 154$l$ may be positioned on the second gate electrode 124$l$, and the third semiconductor 154$c$ may be positioned on the third gate electrode 124$c$. The first semiconductor 154$h$ and the second semiconductor 154$l$ may be connected to each other and the second semiconductor 154$l$ and the third semiconductor 154$c$ may also be connected to each other. In addition, the first semiconductor 154$h$ may also be formed to be extended up to below a data line 171, The first to third semiconductors 154$h$, 154$l$, and 154$c$ may be made of an amorphous silicon, a polycrystalline silicon, a metal oxide, or the like.

Ohmic contacts (not shown) may be further formed on the first to third semiconductors 154$h$, 154$l$, and 154$c$, respectively. The ohmic contacts may be made of silicide or a material such as n+ hydrogenated amorphous silicon which is doped with n-type impurities at high concentration.

Data conductors including the data line 171, a first source electrode 173$h$, a second source electrode 173$l$, a third source electrode 173$c$, a first drain electrode 175$h$, a second drain electrode 175$l$, and a third drain electrode 175$c$ are formed on the first to third semiconductors 154$h$, 154$l$, and 154$c$.

The data line 171 transfers a data signal and is mainly extended in a vertical direction so as to intersect with the gate line 121 and the step-down gate line 123. Each data line 171 includes the first source electrode 173$h$ and the second source electrode 173$l$ which are extended to the first gate electrode 124$h$ and the second gate electrode 124$l$ and connected to each other.

The first drain electrode 175h, the second drain electrode 175l, and the third drain electrode 175c include a wide end portion of one side and an end portion of the other side having a rod shape. The end portions having the rod shape of the first drain electrode 175h and the second drain electrode 175l are partially surrounded by the first source electrode 173h and the second source electrode 173l. The wide end portion of one side of the second drain electrode 175l is again extended so as to form the third source electrode 173c which is bent in a shape of 'U'. The wide end portion 177c of the third drain electrode 175c is overlapped with the capacity electrode 137 so as to form a step-down capacitor Cstd, and the end portion having the rod shape thereof is partially surrounded by the third source electrode 173c.

The first gate electrode 124h, the first source electrode 173h, and the first drain electrode 175h form a first thin film transistor Qh together with the first semiconductor 154h. The second gate electrode 124l, the second source electrode 173l, and the second drain electrode 175l form a second thin film transistor Ql together with the second semiconductor 154l. The third gate electrode 124c, the third source electrode 173c, and the third drain electrode 175c form a third thin film transistor Qc together with the third semiconductor 154c.

The first semiconductor 154h, the second semiconductor 154l, and the third semiconductor 154c may be connected to each other to be linear, and may have substantially the same plane shape as the data conductors 171, 173h, 173l, 173c, 175h, 175l, 175c and the ohmic contacts therebelow, except for channel regions between the source electrodes 173h, 173l, and 173c and the drain electrodes 175h, 175l and 175c.

The first semiconductor 154h has a portion which is not covered by the first source electrode 173h and the first drain electrode 175h and exposed between the first source electrode 173h and the first drain electrode 175h. The second semiconductor 154l has a portion which is not covered by the second source electrode 173l and the second drain electrode 175l and exposed between the second source electrode 173l and the second drain electrode 175l. The third semiconductor 154c has a portion which is not covered by the third source electrode 173c and the third drain electrode 175c and exposed between the third source electrode 173c and the third drain electrode 175c.

The passivation layer 180 is formed on the data conductors 171, 173h, 173l, 173c, 175h, 175l, and 175c and the semiconductors 154h, 154l, and 154c exposed between the respective source electrodes 173c, 173l, and 173c and the respective drain electrodes 175h, 175l, and 175c. The passivation layer 180 may be made of an organic insulating material or an inorganic insulating material, and may be formed of a single film or multiple films.

The passivation layer 180 is provided with a plurality of first contact holes 185h and a plurality of second contact holes 185l which each extend to and expose the wide end portion of the first drain electrode 175h and the wide end portion of the second, drain electrode 175l.

A pixel electrode 191 is formed on the passivation layer 180. The pixel electrode 191 may be made of a transparent metal material such as an indium-tin-oxide (ITO), an indium-zinc-oxide (IZO), or the like.

In this case, the pixel electrode 191 may be formed of the same material as the first layer 195a or the third layer 195c of the anode electrode 195.

The pixel electrodes 191 are separated from each other while having the gate line 121 and the step-down gate line 123 therebetween, and include a first sub-pixel electrode 191h and a second sub-pixel electrode 191l which are disposed at the top and bottom of the pixel region PX based on the gate line 121 and the step-down line 123 and neighboring each other in the column direction.

The first sub-pixel electrode 191h and the second sub-pixel electrode 191l are each connected to the first drain electrode 175h and the second drain electrode 175l through the first contact hole 185h and the second contact hole 185l. Therefore, when the first thin film transistor Qh and the second thin film transistor Ql are in an ON state, the first sub-pixel electrode 191h and the second, sub-pixel electrode 191l are applied with a data voltage from the first drain electrode 175h and the second drain electrode 175l.

The entire shape of each of the first sub-pixel electrode 191h and the second sub-pixel electrode 191l is a quadrangular shape. Each of the first sub-pixel electrode 191h and the second sub-pixel electrode 191l includes a cross stem part including horizontal stem parts 193h and 193l and vertical stem parts 192h and 192l intersecting with the horizontal stem parts 193h and 193l. In addition, each of the first sub-pixel electrode 191h and the second sub-pixel electrode 191l includes a plurality of fine branch parts 194h and 194l and protrusion parts 197h and 197l which downwardly or upwardly protrudes from edge sides of the sub-pixel electrodes 191h and 191l.

The pixel electrode 191 is divided into four sub-regions by the horizontal stem parts 193h and 193l and the vertical stem parts 192h and 192l. The fine branch parts 194h and 194l is obliquely extended from the horizontal stein parts 193h and 193l and the vertical stem parts 192h and 192l, and the extension direction thereof may form an angle of approximately 45° or 135° with the gate line 121 or the horizontal step parts 193h and 193l. Directions in which the fine branch parts 194h and 194l of the two neighboring sub-regions are extended may be perpendicular to each other.

In the present exemplary embodiment, the first sub-pixel electrode 191h further includes an outer step part surrounding an outer portion and the second sub-pixel electrode 191l further includes horizontal parts positioned at upper end and lower end, and left and right vertical parts 198 positioned at left and right of the first sub-pixel electrode 191h. The left and right vertical part 198 may prevent capacitive coupling, that is, a coupling between the data line 171 and the first sub-pixel electrode 191h.

The layout of the pixel region, the structure of the thin film transistor, and the shape of the pixel electrode as described above are merely an example, the inventive concept is not limited thereto and may be variously modified.

A common electrode 270 is formed on the pixel electrode 191 so as to be spaced apart from the pixel electrode 191 by a predetermined distance. The microcavity 305 is formed between the pixel electrode 191 and the common electrode 270. The microcavity 305 is surrounded by the pixel electrode 191 and the common electrode 270. The microcavity 305 may have a width and an area that are variously varied depending on a size and resolution of the display device.

The common electrode 270 may be made of a transparent metal material such as an indium-tin-oxide (ITO), an indium-zinc-oxide (IZO), or the like. The common electrode 270 may be applied with a predetermined voltage, and an electric field may be formed between the pixel electrode 191 and the common electrode 270.

A first alignment layer 11 is formed on the pixel electrode 191. The first alignment layer 11 may also be formed immediately on. the passivation layer 180 which is not covered by the pixel electrode 191.

A second alignment layer 21 is formed below the common electrode 270 so as to face the first alignment layer 11.

The first alignment layer 11 and the second alignment layer 21 may be formed of a vertical alignment layer and made of an alignment material such as polyamic acid, polysiloxane, polyimide (PI), or the like. The first and second alignment layers 11 and 21 may be connected to each other at the edge of the pixel region PX.

A liquid crystal layer made of liquid crystal molecules 310 is formed in the microcavity 305 positioned between the pixel electrode 191 and the common electrode 270. The liquid crystal molecules 310 may have negative dielectric constant anisotropy and may stand in a direction which is perpendicular to the substrate 110 in a state in which the electric field is not applied thereto. That is, the vertical alignment may be implemented.

The first sub-pixel electrode 191h and the second sub-pixel electrode 191l to which the data voltage is applied generate the electric field together with the common electrode 270, so as to determine a direction of the liquid crystal molecule 310 positioned in the microcavity 305 between the two electrode 191 and 270. Luminance of light passing through the liquid crystal layer is changed depending on the direction of the liquid crystal molecule 310 determined as described above.

Hereinabove, the liquid crystal display according to an exemplary embodiment is described as a vertical electric field mode structure in which the liquid crystal layer is formed between the pixel electrode 191 and the common electrode 270, but is not limited thereto. For example, the liquid crystal display may be formed in a horizontal electric field mode structure in which the pixel electrode 191 and the common electrode 270 may be formed on the same layer as each other.

However, the liquid crystal display according to an exemplary embodiment may be suitably formed in the vertical electric field mode rather than the horizontal electric field mode in order to obtain excellent transmittance by transmitting light by the light amount controlling region CA.

In the horizontal electric field mode structure, since a long axis of the liquid crystal is arranged while maintaining a horizontal direction to the surface of the substrate, wide angle of field characteristic is obtained, but transmittance is relatively decreased. On the other hand, in the vertical electric field mode structure, since the long axis of the liquid crystal is arranged while maintaining a vertical direction to the surface of the substrate, an angle of field narrower than that of the horizontal electric field mode structure is obtained, but transmittance is relatively excellent.

Therefore, the liquid crystal display according to an exemplary embodiment is designed so as to be driven in the vertical electric field mode by the light amount controlling region CA, thereby making it possible to increase transmittance to improve transparency.

A first insulating layer 350 may be further formed on the common electrode 270. The first insulating layer 350 may be made of an inorganic insulating material such as silicon nitride (SiNx), silicon oxide (SiOx), silicon oxynitride (SiOxNy), or the like, and may be omitted, if necessary.

The roof layer 360 is formed on the first insulating layer 350. The roof layer 360 may be made of an organic material. The microcavity 305 is formed below the roof layer 360 and the roof layer 360 may be hardened by a hardening process so as to maintain a shape of the microcavity 305. That is, the roof layer 360 is formed so as to be spaced apart from the pixel electrode 191 while having the microcavity 305 therebetween.

The roof layer 360 is formed in. each light amount controlling region CA and the second valley V2 along a row and is not formed in the first valley V1. The microcavity 305 is not formed below the roof layer 360 in the second valley V2 and is formed so as to be attached to the first substrate 110. Therefore, the roof layer 360 positioned in the vertical valley V2 may be formed to have a thickness thicker than that of the roof layer 360 positioned in each light amount controlling region CA. An upper surface and both side surfaces of the microcavity 305 form a shape covered by the roof layer 360.

The common electrode 270, the first insulating layer 350, and the roof layer 360 are provided with the injection hole 307, sometimes called a liquid crystal injection hole 307, that expose a portion of the microcavity 305. The injection hole 307 may be formed in one side surface of the light amount controlling region CA that faces the pixel region DA. That is, the injection hole 307 may be formed so as to extend to and expose one side surface of the microcavity 305 that faces the pixel region DA. Since the microcavity 305 is exposed by the injection hole 307, the alignment liquid, the liquid crystal material, or the like may be injected into the microcavity 305 through the injection hole 307.

A second insulating layer 370 may be further formed on the roof layer 360. The second insulating layer 370 may be made of an inorganic insulating material such as silicon nitride (SiNx), silicon oxide (SiOx), silicon oxynitride (SiOxNy), or the like. The second insulating layer 370 may be formed to cover the upper surface and the side surfaces of the roof layer 360. The second insulating layer 370 serves to protect the roof layer 360 made of an organic material.

Hereinabove, the structure in which the second insulating layer 370 is formed on the roof layer 360 has teen described, but the inventive concept is not limited and the second insulating layer 370 may be omitted.

An overcoat 390 may be formed on the second insulating layer 370. The overcoat 390 is formed to cover the injection hole 307 that exposes a portion of the microcavity 305 to the outside. That is, the overcoat 390 may seal the microcavity 305 so that the liquid crystal molecules 310 formed in the microcavity 305 are not leaked to the outside. Since the overcoat 390 is in contact with the liquid crystal molecules 310, it may be made of a material which does not react with the liquid crystal molecules 310. For example, the overcoat 390 may be made of parylene, or the like.

The overcoat 390 may be formed, of a multilayer such, as a bi-layer or a triple-layer. The bi-layer includes two layers made of different materials. The triple-layer includes three layers, wherein the layers adjacent to each other are made of different materials. For example, the overcoat 390 may include a layer made of an organic insulating material and a layer made of an inorganic insulating material.

Hereinafter, a transparent display device according to another exemplary embodiment will be described with reference to FIG. 7.

Figure 7:
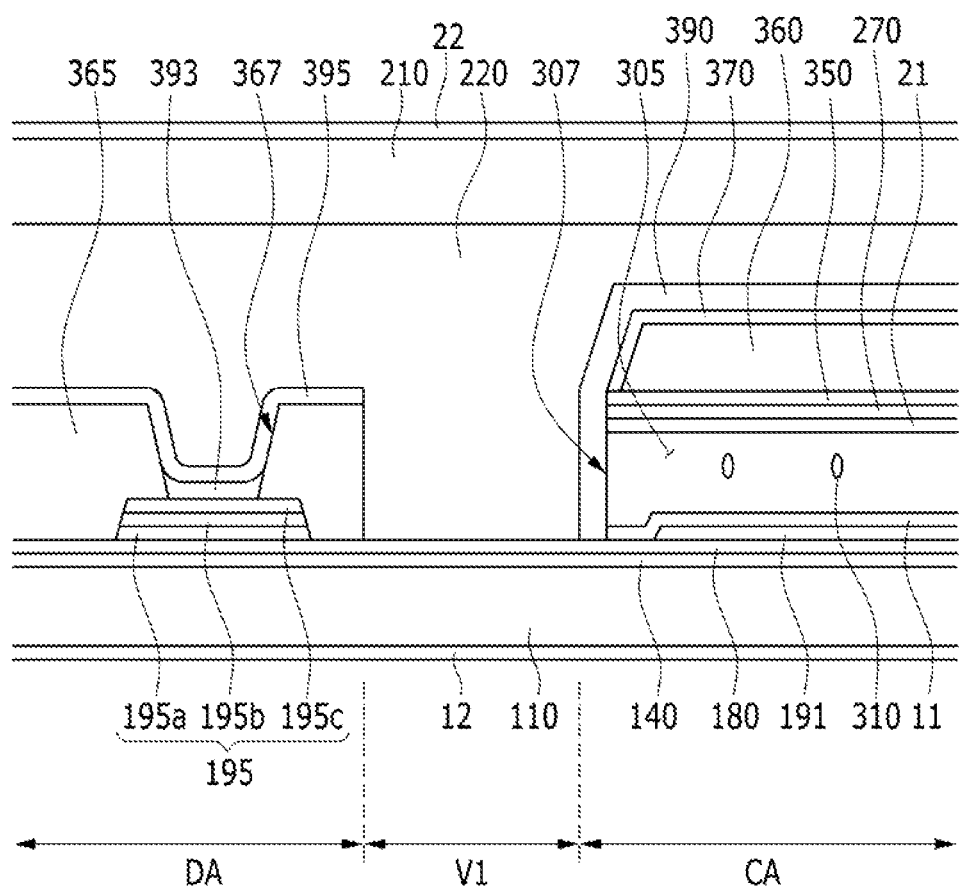
FIG. 7 is a cross-sectional view showing a portion of a transparent display device according to another exemplary embodiment.

FIG. 7 is a cross-sectional view showing a portion of a transparent display device according to another exemplary embodiment, wherein the transparent display device is the same as the transparent display device shown in FIG. 4 as described above, except that polarizing plates 12 and 22 are added. Therefore, the same configurations are denoted by the same reference numerals and an overlapped description thereof will be omitted.

The polarizing plates 12 and 22 may be further formed on upper and lower surfaces of the transparent display device according to another exemplary embodiment. The polarizing plates may include the first polarizing plate 12 and the second polarizing plate 22. The first polarizing plate 12 may be attached onto a lower surface of the substrate 110 and the second polarizing plate 22 may be attached onto an upper surface of the second substrate 210.

In this case, the second polarizing plate 22 may be formed on the second substrate 210 and may be formed on the planarization layer 220 in the case in which the second substrate 210 is omitted. The planarization layer 220 needs to have a flat surface. In the case in which the surface of the planarization layer 220 is not flat, the second polarizing, plate 22 is not uniformly attached, and consequently, a region in which the second polarizing plate 22 is lifted may occur.

In this case, the first polarizing plate 12 and the second polarizing plate 22 are formed so as to have light transmission axes to be perpendicular to each other, thereby making it possible to adjust transmittance of light depending on an arrangement state of the liquid crystal layer.

The polarizing plates 12 and 22 may include a polarizing element producing polarized light and a tri-acetyl-cellulose (CAC) layer for securing durability.

Figure 8:
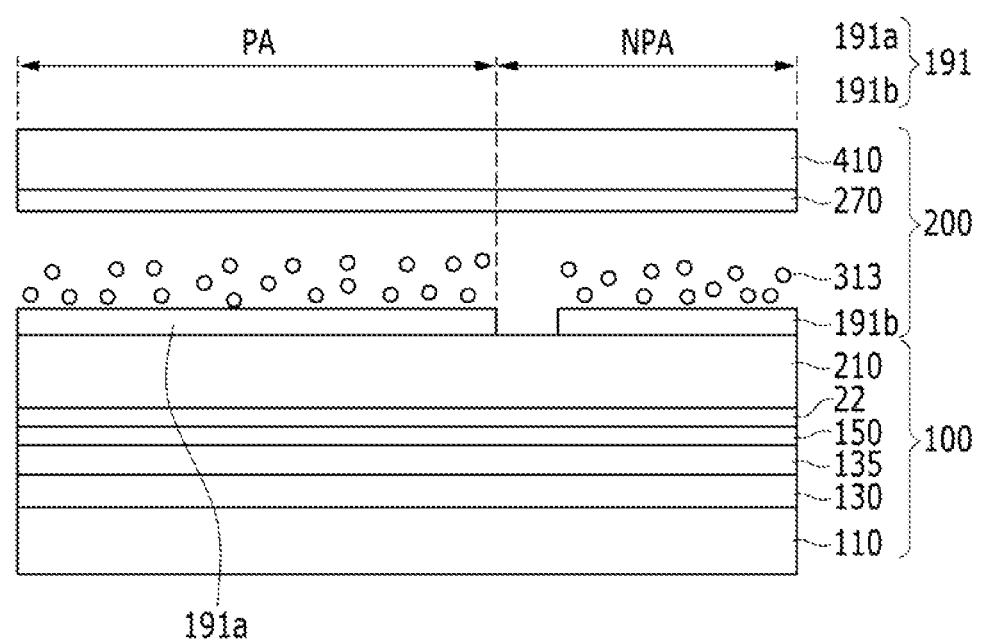
FIG. 8 is a schematic cross-sectional view of a transparent display device according to a Comparative Example of the inventive concept.

FIG. 8 is a schematic cross-sectional view of a transparent display device according to Comparative Example of the inventive concept.

Referring to FIG. 8, the transparent display device according to Comparative Example of the inventive concept includes a display panel 100 and a reflective panel 200.

The display panel 100 display an image in an upward direction and the image selectively transmits through the reflective panel 200. The display panel 100 includes a first substrate 110, a second substrate 210, a driving unit 130, an organic light emitting device 135, a phase retardation plate 150, and the polarizing plate 22.

The driving unit 130 and the organic light emitting device 135 formed on the first substrate 110 are positioned between the first substrate 110 and the second substrate 210.

The driving unit 130 includes a switching and driving thin film transistor (not shown) and drives the organic light emitting device 135. The organic light emitting device 135 emits light in response to a driving signal transferred from the driving unit 130 so as to display the image in the upward direction.

The phase retardation plate 150 and the polarizing plate 22 are sequentially stacked in the upward direction on a path on which the image is displayed.

The phase retardation plate 150 is positioned between the organic light emitting device 135 and the second substrate 210. The phase retardation plate 150 serves to convert an optical axis of light by retarding a phase of light passing through the phase retardation plate 150 by $\lambda/4$. The polarizing plate 22 is positioned between the phase retardation plate 150 and the second substrate 210.

The polarizing plate 22 is attached to the second substrate 210 together with the phase retardation plate 150. The polarizing plate 22 linearly polarizes the light passing through the polarizing plate 22 and suppresses a reflection of external light irradiated to the organic light emitting device 135 from the outside together with the phase retardation plate 150, thereby serving to improve an image displayed from the organic light emitting device 135.

The reflective panel 200 is positioned on the display panel 100.

The reflective panel 200 selectively transmits or reflects light to a region corresponding to the image displayed by the display panel 100. The reflective panel 200 includes the second substrate 210, a third substrate 410, a pixel electrode 191, a common electrode 270, and a charged particle 313.

In this case, the reflective panel 200 shares the second substrate 210 with the display panel 100, but may include other substrate(s) positioned on the second substrate 210.

The charged particles 313 are positioned in a spaced space between the common electrode 270 and the pixel electrode 191, and reflect light so as to have white color and to be charged in one polarity. The pixel electrode 191 includes a first pixel electrode 191a positioned in a display region PA and a second pixel electrode 191b positioned in a non-display region NPA.

The charged particles 313 are positioned at the common electrode 270 side in response to the common electrode 270 and the first pixel electrode 191a in the case in which the common electrode 270 and the first pixel electrode 191a are applied with the electric field and is positioned so as to correspond to the display region PA of the display panel 100. The charged particles 313 are positioned, at the second pixel electrode 191b side in response to the second pixel electrode 191b and the common electrode 270 in the case in which the second pixel electrode 191b and the common electrode 270 are applied with the electric field and is positioned so as to correspond to the non-display region NPA of the display panel 100

As such, the charged particles 313 are positioned so as to selectively correspond to the display region PA or the non-display region NPA, such that the reflective panel 200 selectively transmits or reflects the light with the display region PA of the display panel 100.

However, since the transparent display device according to Comparative Example of the inventive concept as described above has the display panel 100 and the reflective panel 200 that are vertically disposed, an entire thickness thereof becomes thick, which is disadvantageous to bend.

On the contrary, the transparent display device according to an embodiment has the organic light emitting display disposed in a pixel region between the first substrate and the second substrate in order to display the pixel. The transparent display device further includes the liquid crystal display disposed in the light amount controlling region positioned so as to be in parallel to and adjacent to the pixel region in order to adjust transmission of the external light. Thus, the thickness thereof is not thick, and consequently, the transparent display device may be advantageously bent.

In addition, since the liquid crystal display of the transparent display device according to the exemplary embodiment may be implemented by the plurality of microcavities 305 in which the plurality of pixels are partitioned from each other, there is no degradation, in image quality occurring when the transparent display device is bent or curved.

Next, a method of manufacturing a transparent display device according to an exemplary embodiment will be described below with reference to FIGS. 12 to 21.

Figure 12:
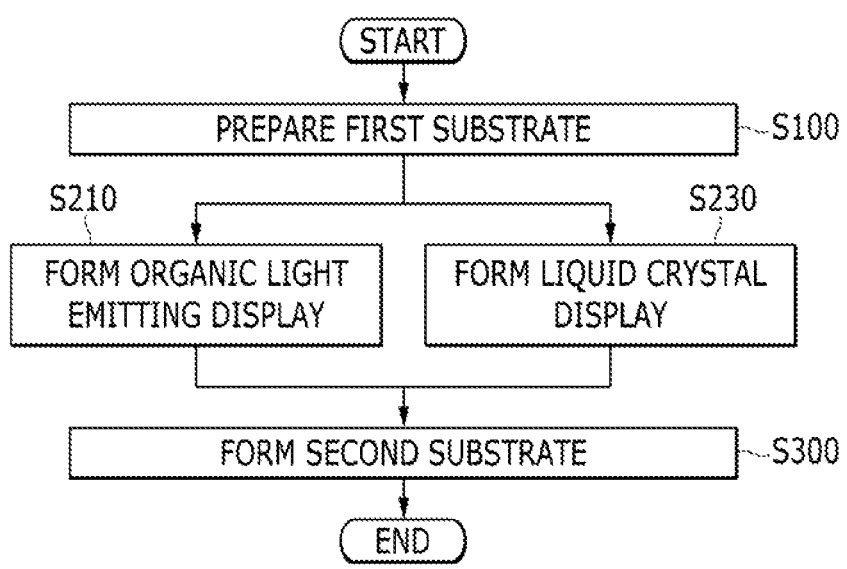
FIG. 12 is a flowchart for describing a method of manufacturing a transparent display device according to an exemplary embodiment.

FIG. 12 is a flowchart for describing a method of manufacturing a transparent display device according to an exemplary embodiment and FIGS. 13 to 22 are process cross-sectional views showing the method of manufacturing the transparent display device according to an exemplary embodiment.

Referring to FIG. 12, in the method of manufacturing the transparent display device according to an exemplary embodiment, a first substrate including a pixel region and a light amount controlling region is first prepared (S100).

Next, an organic light emitting display is formed in the pixel region of the first substrate (S210) and a liquid crystal display is formed in the light amount controlling region of the first substrate (S230).

In this case, the organic light emitting display includes an anode electrode, a pixel defined layer covering an edge of the anode electrode and including an opening part 367 exposing a portion of the anode electrode, a light emitting layer positioned on the anode electrode exposed by the opening part 367, and a cathode electrode positioned on the light emitting layer. The liquid crystal display includes a pixel electrode, a roof layer facing the pixel electrode, and a liquid crystal layer having a plurality of microcavities partitioned from each other between the pixel electrode and the roof layer, wherein the microcavities are made of liquid crystal molecules.

Next, a second substrate sealing the organic light emitting display and the liquid crystal display is formed (S300).

Figure 13:
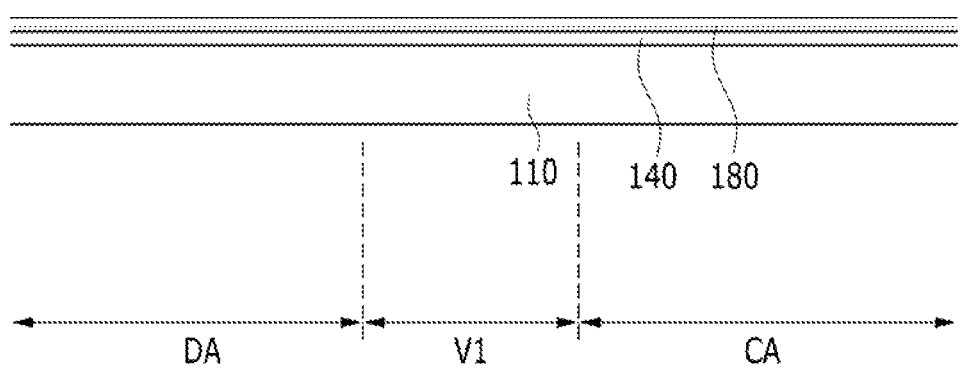
FIGS. 13, 14, 15, 16, 17, 18, 19, 20, 21, and 22 are process cross-sectional views showing the method of manufacturing the transparent display device according to an exemplary embodiment.

First, referring to FIG. 13, the first substrate 110 includes a pixel region DA, a light amount controlling region CA, and a first valley V1 positioned between the pixel, region DA and the tight amount controlling region CA.

A gate insulating layer 140 and a passivation layer 180 are sequentially stacked on the first substrate 110. The gate insulating layer 140 may be made of an inorganic insulating material such as silicon nitride (SiNx), silicon oxide (SiOx), or the like. In addition, the gate insulating layer 140 may be formed of a single film or multiple films. The passivation layer 180 may be made of an organic insulating material or an inorganic insulating material, and may be formed of a single film or multiple films.

Figure 14:
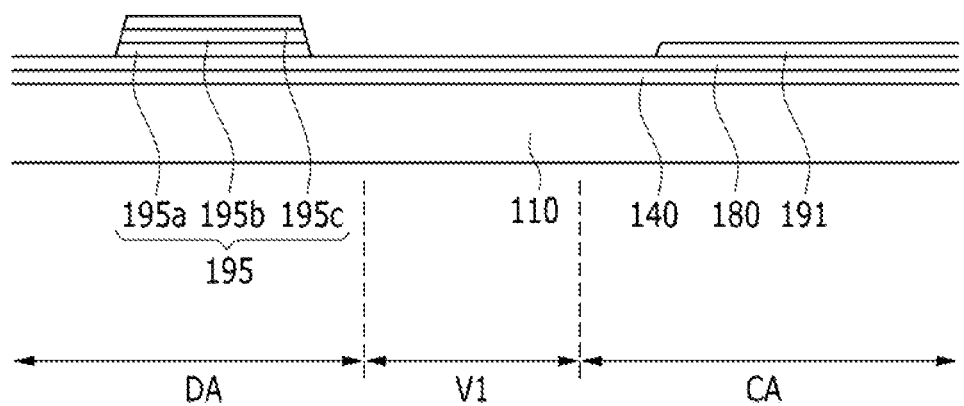

Next, referring to FIG. 14, an anode electrode 195 is patterned and formed in the pixel region DA of the first substrate 110 and a pixel electrode 191 is patterned and formed in the light amount controlling region CA of the first substrate 110.

The anode electrode 195 may be formed in a triple-layer including a first layer 195a made of a transparent conductive material, a second layer 195b made of a metal material, and a third layer 195c made of a transparent conductive material, and the pixel electrode 191 may be formed in a single layer in another embodiment.

Although not shown, the anode electrode 195 and the pixel electrode 191 may be simultaneously patterned, and formed by using a half-tone mask or a slit mask.

In this case, the pixel electrode 191 may be formal of the same material as the first layer 195a or the third layer 195c of the anode electrode 195.

The first layer and the third layer may be made of indium-tin-oxide (ITO) and the second layer may be made of any one of silver (Ag), aluminum (Al), magnesium (Mg), lithium (Li), calcium (Ca), aluminum-lithium (Al—Li), magnesium-indium (Mg—In), magnesium-silver (Mg—Ag), aluminum-silver (Al—Ag), or the like.

Figure 15:
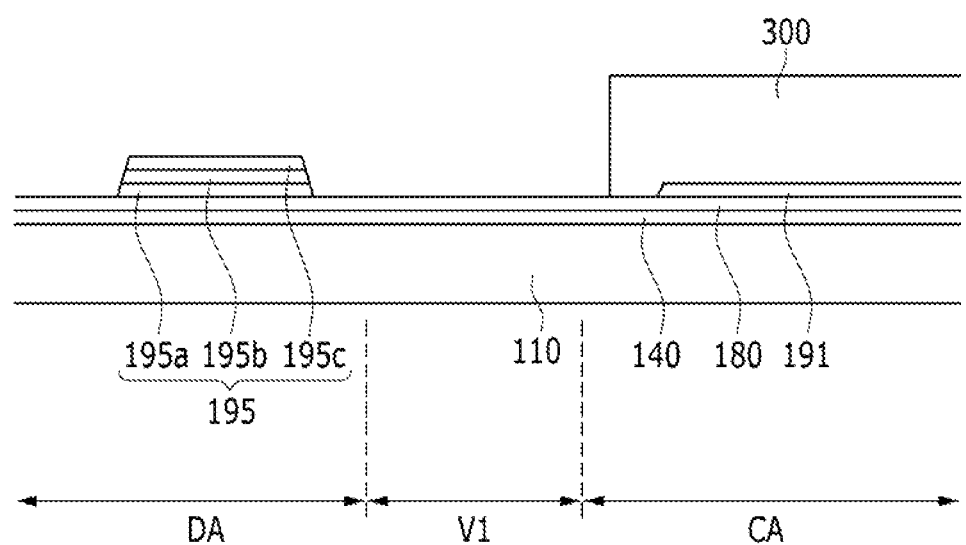

Next, referring to FIG. 15, a sacrificial layer 300 is formed by applying a photosensitive organic material on the pixel electrode 191 of the light amount controlling region CA and performing a photo process. The sacrificial layer 300 may be made of a positive photosensitive material.

Figure 16:
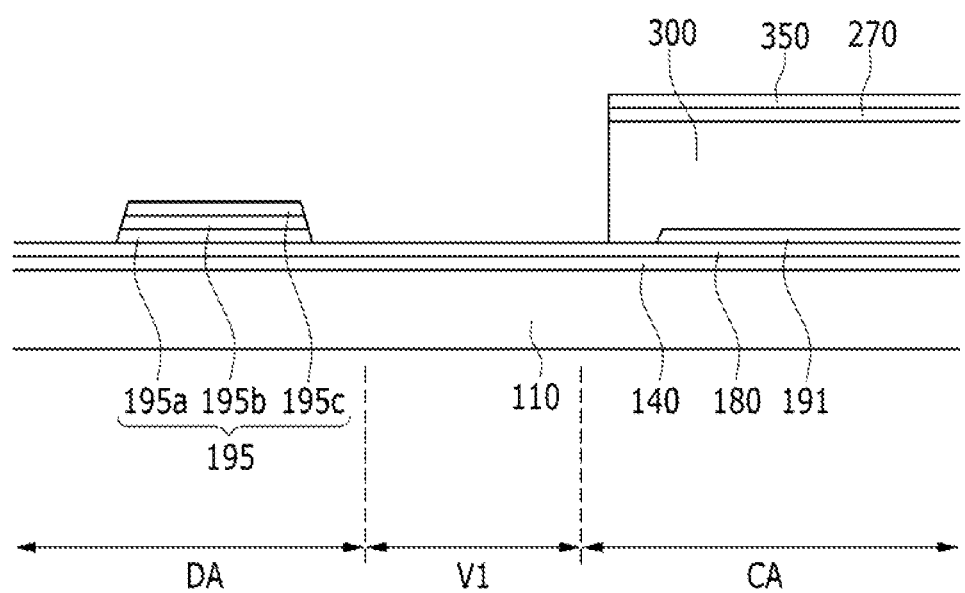

Next, referring to FIG. 16, a common electrode 270 is patterned and formed on the sacrificial layer 300 of the light amount controlling region CA and a first insulating layer 350 is patterned and formed on the common electrode 270.

The common electrode 270 may be made of a transparent metal material such as an indium-tin-oxide (ITO), an indium-zinc-oxide (IZO), or the like.

The first insulating layer 350 may be made of an inorganic insulating material such as silicon nitride (SiNx), silicon oxide (SiOx), silicon oxynitride (SiOxNy), or the like, and may be omitted, if necessary.

Figure 17:
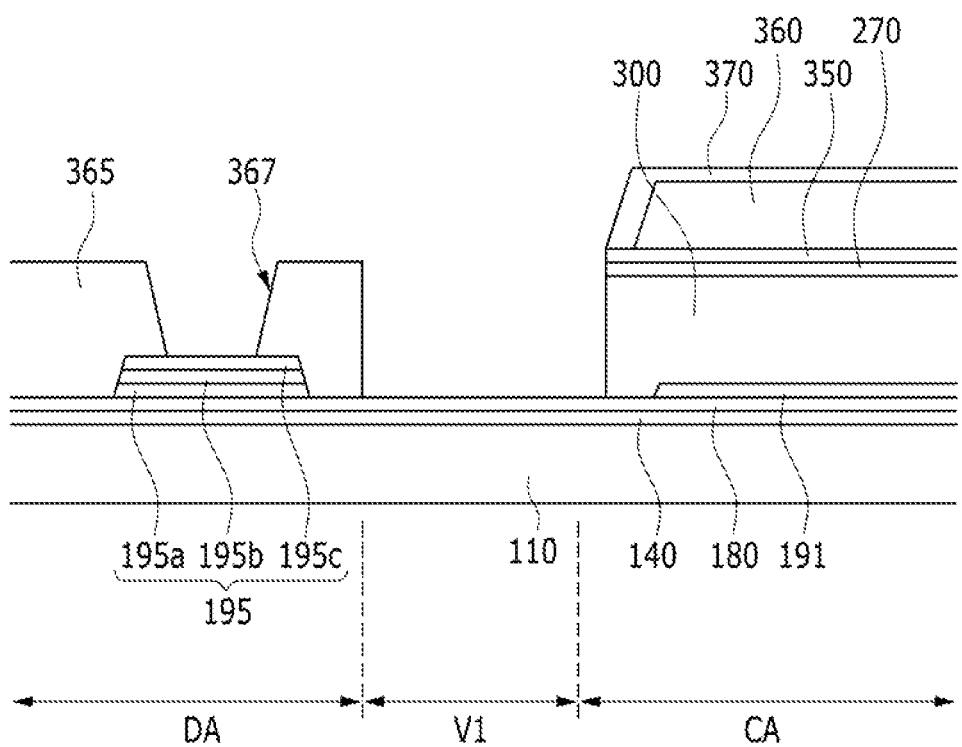

Next, referring to FIG. 17, a pixel defined layer 365 is patterned and formed in the pixel region DA of the first substrate 110 and a roof layer 360 is patterned and formed in the light amount controlling region CA of the first substrate 110.

In this case, the pixel defined layer 365 and the roof layer 360 may be made of the same organic material.

The pixel defined layer 365 is patterned and formed so as to include an opening part 367 that extends to and exposes a portion of the anode electrode 195 and the roof layer 360 is formed on the first insulating layer 350 of the light amount controlling region CA.

In addition, a second insulating layer 370 made of an inorganic insulating material such as silicon nitride (SiNx), silicon oxide (SiOx), or the like may be formed on the roof layer 360. Since the second insulating layer 370 is formed on the patterned roof layer 360, it may cover and protect the side surfaces of the roof layer 360.

Figure 18:
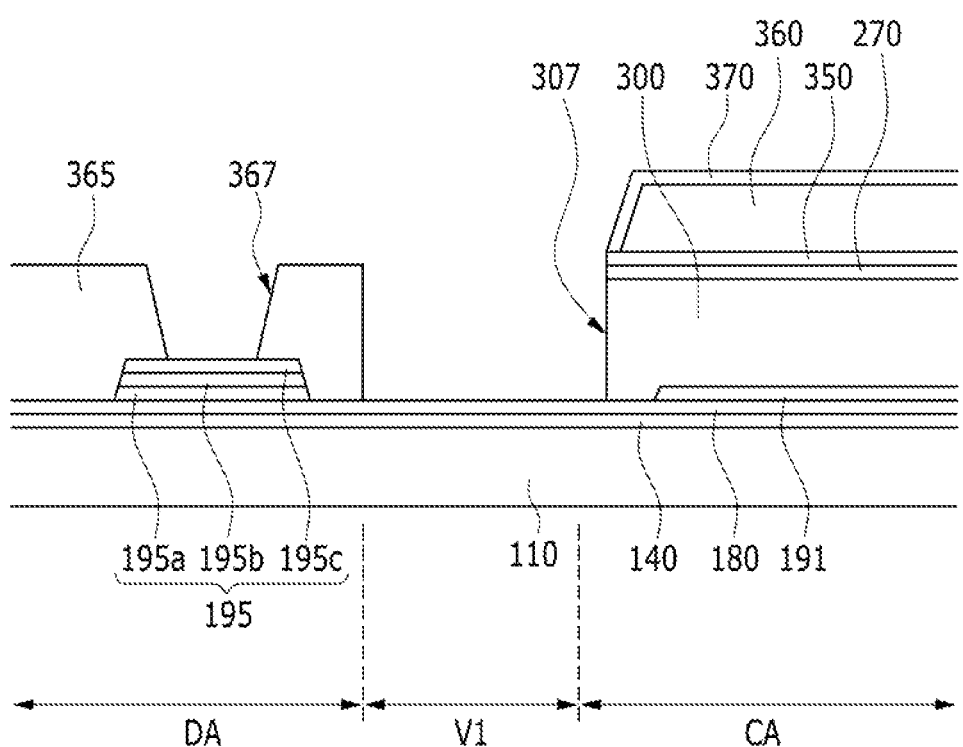

Next, referring to FIG. 18, a liquid crystal injection hole 307 is formed by exposing a portion of the sacrificial layer 300. The liquid crystal injection hole 307 is formed along a first valley V1.

In addition, a microcavity is formed between the pixel electrode 191 and the common electrode 270 by removing the sacrificial layer 300. The sacrificial layer 300 is entirely removed by supplying oxygen plasma to perform an ashing process or supplying a developer on the first substrate 110 having the exposed sacrificial layer 300. Once the sacrificial layer 300 is removed, the microcavity 305 is generated at a position at which the sacrificial layer 300 was positioned.

The pixel electrode 191 and the common electrode 270 are spaced apart from each other while having the microcavity 305 therebetween, and the pixel electrode 191 and the roof layer 360 am spaced apart from each other while having the microcavity 305 therebetween. The common electrode 270 and the roof layer 360 are formed to cover the upper surface and both side surfaces of the microcavity 305.

Next, the roof layer 360 is hardened by applying heat to the first substrate 110. The above-mentioned process is to maintain the shape of the microcavity 305 by the roof layer 360.

Figure 19:
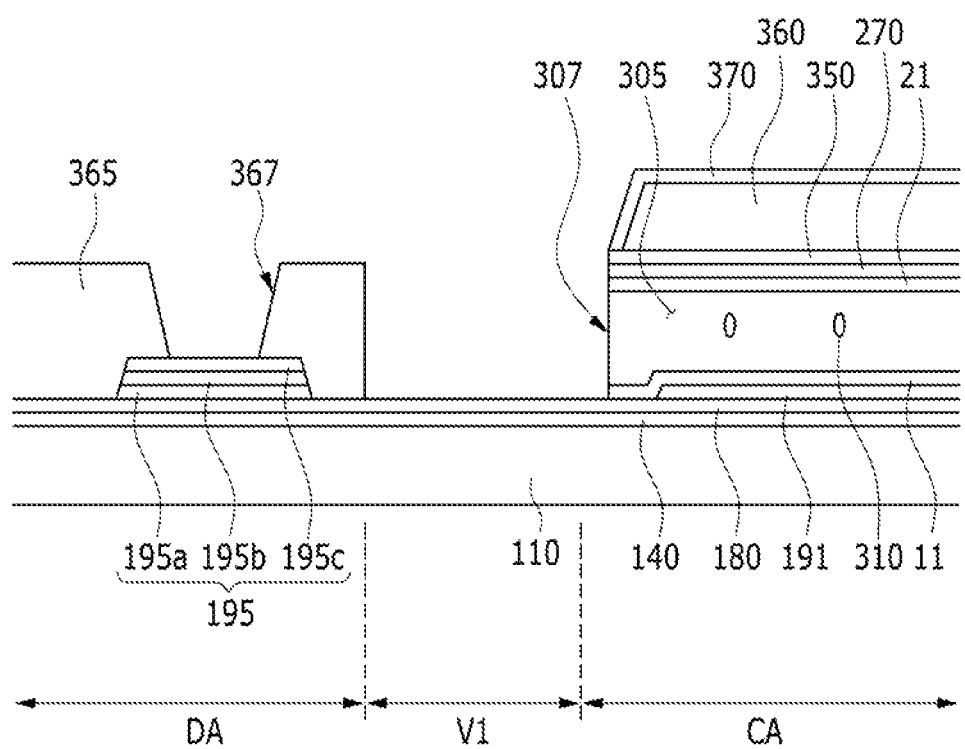

Next, referring to FIG. 19, a first alignment layer 11 and a second alignment layer 21 are formed in the microcavity 305.

In the case in which an alignment liquid containing an alignment material drops on the first substrate 110 by using a spin coating method or an inkjet method, the alignment liquid is injected into the microcavity 305 through the injection hole 307. Once the alignment liquid is injected into the microcavity 305 and a hardening process is then performed, solution components are evaporated and the alignment material remains on inner wall surfaces of the microcavity 305.

Therefore, the first alignment layer 11 may be formed on the pixel electrode 191 and the second alignment layer 21 may be formed below the common electrode 270. The first alignment layer 11 and the second alignment layer 21 are formed so as to face each other while having the microcavity 305 therebetween.

In this case, the first and second alignment layers 11 and 21 may have alignment formed in a direct which is perpendicular to the substrate 110, except for the side surfaces of the microcavity 305. Additionally, the alignment may be formed in a direction which is parallel to the substrate 110 by irradiating ultraviolet (UV) onto the first and second alignment layers 11 and 21.

Next, in the case in which the liquid crystal material made of liquid crystal molecules 310 drops on the first substrate 110 by using an Inkjet method or a dispensing method, the liquid crystal material is injected into the microcavity 305 through the injection hole 307. In this case, the liquid crystal material may be dropped on the liquid crystal injection hole 307 formed along odd-numbered first valleys V1 and may not be dropped on liquid crystal injection hole 307 formed along even-numbered first valley V1. On the contrary, the liquid crystal material may be dropped on the liquid crystal injection hole 307 formed along even-numbered first valleys V1 and may not be dropped on liquid crystal injection hole 307 formed along odd-numbered first valley V1.

Once the liquid material is dropped, on the liquid crystal, injection hole 307 formed along the odd-numbered first valley V1, the liquid crystal material passes through the liquid crystal injection hole 307 by capillary force and enters the microcavity 305. In this case, air in the microcavity 305 is discharged through the liquid crystal injection hole 307 formed along the even-numbered first valley V1, which causes the liquid crystal material to be easily entered into the microcavity 305.

In addition, the liquid crystal material may be dropped on all liquid crystal injection holes 307. That is, the liquid crystal material may be dropped on. the liquid crystal injection hole 307 formed along the odd-numbered first valleys V1 and the liquid crystal injection hole 307 formed along the even-numbered first valley V1.

Figure 20:
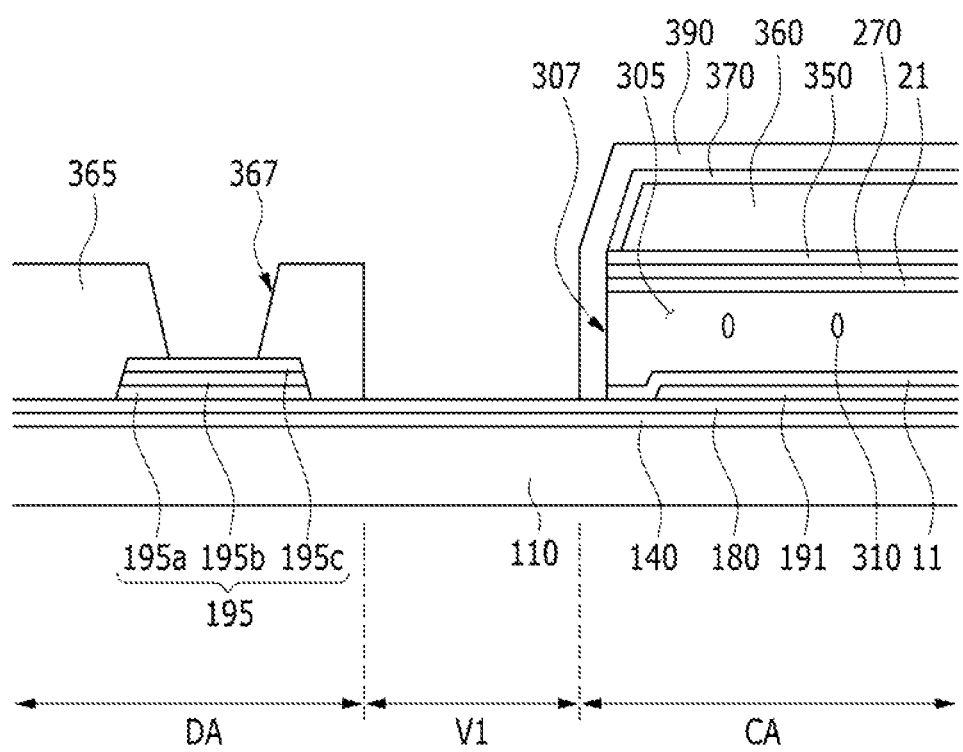

Next, referring to FIG. 20, an overcoat 390 is formed by depositing a material which does not react with the liquid crystal, molecule 310 on the second insulating layer 370. The overcoat 390 is formed so as to cover the injection hole 307 having the microcavity 305 exposed to the outside and seals the microcavity 305.

As such, the liquid crystal display is formed in the light amount controlling region CA.

Figure 21:
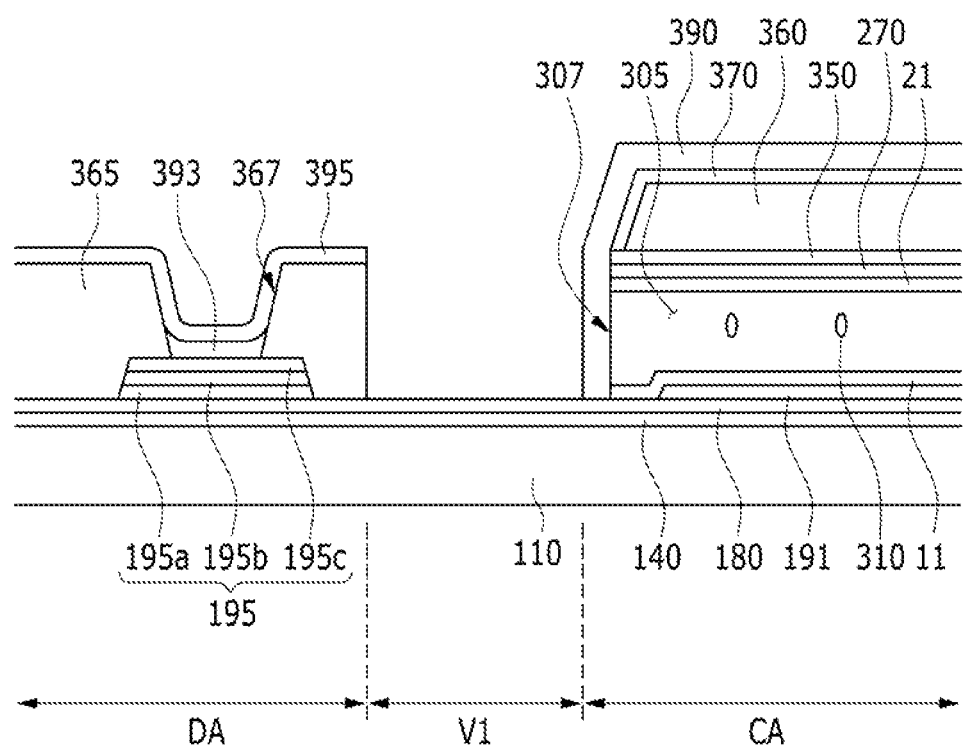

Next, referring to FIG. 21, an organic light emitting layer 393 is formed on the exposed anode electrode 195 in the opening part 367 and a cathode electrode 395 is formed on the organic light emitting layer 393.

The organic light emitting layer 393 expresses colors of red R, green G, and blue B. A general method thereof is to pattern and form a separate organic material emitting colors of red R, green G, and blue B for each pixel region.

As such, the organic light emitting display is formed in the pixel region DA.

The cathode electrode 395 may be formed of a transparent conductive material.

Figure 22:
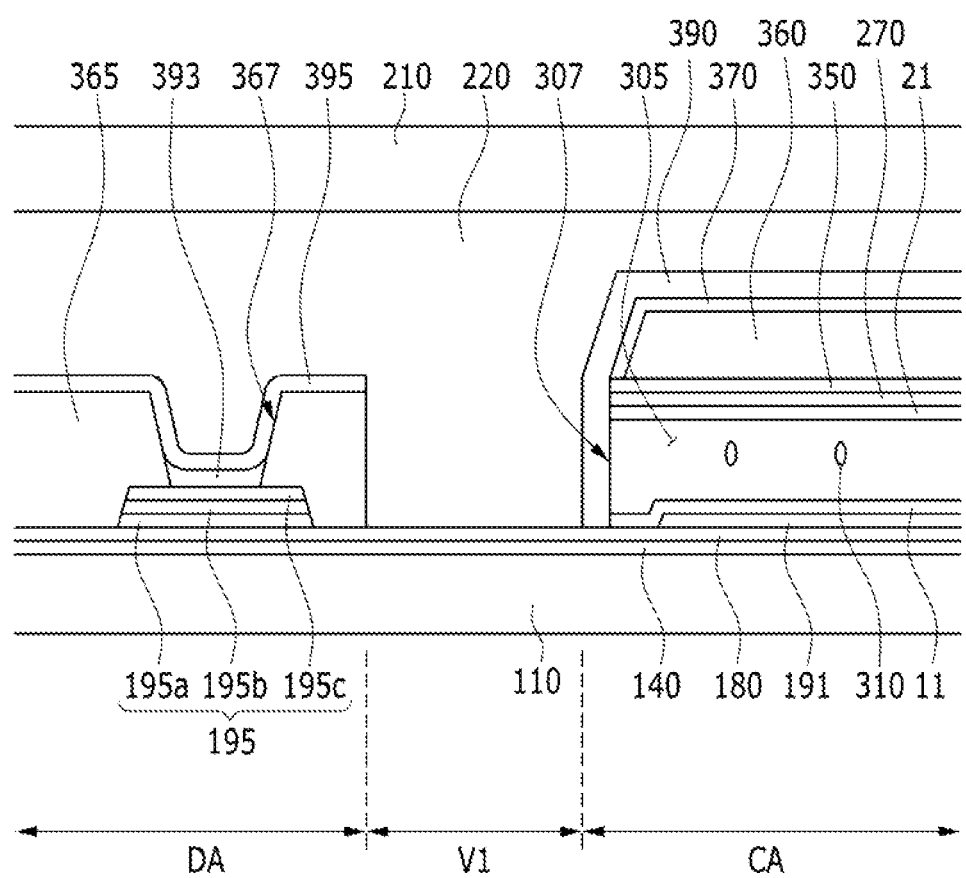

Next, referring to FIG. 22, a planarization layer 220 is formed as an organic layer on a front surface of the first substrate 110 and a second substrate 210 is formed on the planarization layer 220.

Although not shown, the polarizing plates may be further attached onto upper and lower surfaces of the transparent display device. The polarizing plate may include a first polarizing plate and a second polarizing plate. The first polarizing plate may be attached onto the lower surface of the substrate 110 and the second polarizing plate may be attached onto the second substrate 210.

It is required to be flat in order to attach the polarizing plates. To this end, the planarization layer 220 is formed so as to be flat.

The second substrate 210 may be sealed to the first substrate 110 by sealant and may be formed of various materials such as glass, quartz, ceramic, plastic, metal, and the like. Alternatively, the second substrate 210 may be formed by depositing an inorganic layer and an organic layer without using the sealant.

As such, since the organic light emitting display positioned in the pixel region DA of the first substrate 110 and the liquid crystal display positioned in the light amount controlling region CA of the first substrate 110 are simultaneously formed, it is possible to decrease the number of processes of manufacturing the transparent display device and reduce costs for manufacturing the transparent display device.

It will be obvious to those skilled in the art to which the present application pertains that the inventive concept described above is not limited to the above-mentioned exemplary embodiments and the accompanying drawings, but may be variously substituted, modified, and altered without departing from the scope and spirit of the inventive concept.

DESCRIPTION OF SYMBOLS

12: first polarizing plate 22: second polarizing plate
110: first substrate 210: second substrate
195: anode 305: microcavity
360: roof layer 365: pixel defined layer
390: overcoat 393: organic light emitting layer
395: cathode electrode DA: pixel region
CA: light amount controlling region V1: first valley
V2: second valley While the inventive concept has been described in connection with what is presently considered to be practical exemplary embodiments, it is to be understood that the inventive concept is not limited to the disclosed embodiments, but, on the contrary, is intended to cover various modifications and equivalent arrangements included within the spirit and scope of the appended claims.

What is claimed is:

1. A transparent display device comprising:
   a first substrate including a pixel region and a light amount controlling region positioned so as to be in parallel to the pixel region;
   an organic light emitting display positioned in the pixel region on the first substrate and including an anode electrode, a pixel defined layer covering an edge of the anode electrode and including an opening part extending to a portion of the anode electrode, an organic light emitting layer positioned on the anode electrode and in the opening part, and a cathode electrode positioned on the organic light emitting layer;
   a liquid crystal display positioned in the light amount controlling region on the first substrate and including a pixel electrode, a roof layer facing the pixel electrode, and a liquid crystal layer having a plurality of microcavities partitioned from each other between the pixel electrode and the roof layer, wherein the microcavities comprise liquid crystal molecules; and
   a second substrate sealing the organic light emitting display and the liquid crystal display.

2. The transparent display device of claim 1, wherein:
   the anode electrode includes a first layer comprising a transparent conductive material, a second layer comprising a metal material, and a third layer comprising the transparent conductive material, and
   the pixel electrode comprises the same material as the first layer or the third layer.

3. The transparent display device of claim 2, wherein:
the first layer and the third layer comprise indium-tin-oxide (ITO) or indium-zinc-oxide (IZO), and
the second layer comprises any one of silver (Ag), aluminum (Al), magnesium (Mg), lithium (Li), calcium (Ca), aluminum-lithium (Al—Li), magnesium-indium (Mg—In), magnesium-silver (Mg—Ag), and aluminum-silver (Al—Ag).

4. The transparent display device of claim 1, wherein:
the pixel region includes a first pixel, a second pixel, and a third pixel, and
the first pixel, the second pixel, and the third pixel are arranged in a first row while being repeated, and the light amount controlling regions are arranged in a second row while being repeated.

5. The transparent display device of claim 4, further comprising:
a first valley between the pixel region and the light amount controlling region.

6. The transparent display device of claim 5, further comprising:
a liquid crystal injection hole extending to a portion of a microcavity of the microcavities.

7. The transparent display device of claim 6, wherein:
the liquid crystal injection hole is positioned in one side surface of the microcavity facing the pixel region.

8. The transparent display device of claim 7, further comprising:
an overcoat positioned on the roof layer and covering the liquid crystal injection hole.

9. The transparent display device of claim 1, wherein:
the liquid crystal display is configured to adjust an amount of light incident from the outside.

10. The transparent display device of claim 1, wherein:
the liquid crystal display is configured to be driven in a vertical electric field mode.

11. The transparent display device of claim 1, further comprising:
a first polarizing plate attached to a lower surface of the first substrate; and
a second polarizing plate attached to an upper surface of the second substrate.

12. The transparent display device of claim 11, wherein:
the first polarizing plate and the second polarizing plate include a polarizing element configured to produce polarized light and a tri-acetyl-cellulose (CAC) layer for securing durability.

13. The transparent display device of claim 1, wherein:
the second substrate is formed of any one of glass, quartz, plastic, and a metal or is formed by depositing an inorganic layer and an organic layer.

* * * * *